United States Patent
Iizuka et al.

(10) Patent No.: US 10,847,741 B2
(45) Date of Patent: Nov. 24, 2020

(54) ELECTRO-OPTICAL DEVICE, MANUFACTURING METHOD FOR ELECTRO-OPTICAL DEVICE, AND ELECTRONIC APPARATUS

(71) Applicant: SEIKO EPSON CORPORATION, Tokyo (JP)

(72) Inventors: Shota Iizuka, Chitose (JP); Shotaro Izawa, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 20 days.

(21) Appl. No.: 16/257,478

(22) Filed: Jan. 25, 2019

(65) Prior Publication Data
US 2019/0237696 A1    Aug. 1, 2019

(30) Foreign Application Priority Data
Jan. 26, 2018    (JP) .................................. 2018-011306

(51) Int. Cl.
| | |
|---|---|
| *G09G 3/30* | (2006.01) |
| *H01L 51/52* | (2006.01) |
| *G02F 1/1343* | (2006.01) |
| *G02F 1/1333* | (2006.01) |
| *H01L 27/32* | (2006.01) |
| *G02F 1/35* | (2006.01) |

(52) U.S. Cl.
CPC ........ *H01L 51/5203* (2013.01); *G02F 1/1343* (2013.01); *G02F 1/133345* (2013.01); *H01L 27/3246* (2013.01); *H01L 51/5253* (2013.01); *G02F 2001/3505* (2013.01); *H01L 27/3248* (2013.01); *H01L 27/3258* (2013.01)

(58) Field of Classification Search
CPC ............ H01L 51/5253; H01L 51/5203; H01L 27/3246; H01L 27/3248; H01L 27/1222; G02F 1/136277; G02F 1/134363; G02F 1/136227; G02F 2001/13606; G02F 2001/13415; G02F 2001/136295
USPC ..................................................... 345/76, 87
See application file for complete search history.

(56) References Cited

U.S. PATENT DOCUMENTS

| | | | |
|---|---|---|---|
| 2005/0134753 A1 | 6/2005 | Higuchi et al. | |
| 2009/0159906 A1* | 6/2009 | Ishiguro | .............. H01L 27/3258 257/88 |
| 2013/0021542 A1* | 1/2013 | Ito | ..................... G02F 1/133345 349/5 |

FOREIGN PATENT DOCUMENTS

JP    H11-160735 A    6/1999

\* cited by examiner

*Primary Examiner* — Jennifer T Nguyen
(74) *Attorney, Agent, or Firm* — Oliff PLC

(57) ABSTRACT

A first electrode, a first insulating film, a second electrode, a second insulating film, and a pixel electrode are formed on a one surface side of a first substrate of an electro-optical device. The second electrode is electrically connected [to the first electrode] via a first contact hole that penetrates the first insulating film. The second electrode and the second insulating film configure a continuous flat surface, which is the surface on the opposite side to the first substrate, and the pixel electrode is electrically connected to the second electrode. Of the second insulating film, since an inside section positioned inside a concave portion caused by the first contact hole is connected to an outside section provided on the outside of the concave portion, peeling of the inside section is unlikely to occur.

8 Claims, 23 Drawing Sheets

ELECTRO-OPTICAL DEVICE, MANUFACTURING METHOD FOR ELECTRO-OPTICAL DEVICE, AND ELECTRONIC APPARATUS

BACKGROUND

1. Technical Field

The present invention relates to an electro-optical device provided with a pixel electrode on the opposite side of a substrate to an insulating film, a manufacturing method of the electro-optical device, and an electronic apparatus.

2. Related Art

In an electro-optical device, such as a liquid crystal device, an organic electroluminescence device and the like, since a relay electrode and an interlayer insulating film are connected in order between a substrate and a pixel electrode, in order to electrically connect the pixel electrode and the relay electrode, it is necessary to electrically connect the relay electrode and the pixel electrode via a contact hole formed in the interlayer insulating film. In this case, a concave portion caused by the contact hole occurs in the surface of the pixel electrode. This concave portion is not desirable as it may be a cause of disruption of the orientation of liquid crystal molecules in the liquid crystal device, for example.

Here, technology is proposed (refer to JP-A-11-160735 (FIG. 4 and the like)) in which a first relay electrode, a first insulating film, a second relay electrode, and a second insulating film are formed between the substrate and the pixel electrode, the first relay electrode and the second relay electrode are electrically connected to each other via a contact hole formed in the first insulating film, and at the same time, the surface of the second insulating film is leveled and the second relay electrode is exposed. According to this technology, since the pixel electrode can be provided on a flat surface, the concave portion caused by the contact hole can be prevented from occurring in the surface of the pixel electrode.

However, with the configuration described in JP-A-11-160735 (FIG. 4 and the like)), after performing the leveling process, a configuration is obtained in which the second insulating film that is formed inside the concave portion caused by the contact hole is independent from the peripheral second insulating film. Thus, after the leveling process, there is a risk that the second insulating film formed inside the concave portion may peel off before the forming of the pixel electrode. For example, after the leveling process, and before the forming of the pixel electrode, when forming the contact hole, which reaches wiring formed on a lower layer side below the first insulating film, so as to penetrate the first insulating film and the second insulating film, after a resist mask is removed, when performing wet etching using hydrogen fluoride or the like in order to remove residue and the like remaining inside the contact hole, there is a risk that the second insulating film formed inside the concave portion may peel off.

SUMMARY

In light of the foregoing, an object of the invention is to provide an electro-optical device that, even when a concave portion resulting from a contact hole is leveled by an insulating film, is capable of suppressing peeling of the insulating film inside the concave portion, a manufacturing method for the electro-optical device, and an electronic apparatus.

In order to solve the above issue, according to an aspect of the invention, an electro-optical device includes a substrate, a first electrode provided on a one surface side of the substrate, a first insulating film provided on a surface of the first electrode on an opposite side to the substrate, a first contact hole penetrating the first insulating film at a position overlapping in a plan view with the first electrode, a second electrode provided on a surface of the first insulating film on the opposite side to the substrate and being electrically connected to the first electrode via the first contact hole, a second insulating film provided with a surface configuring a flat surface continuous to a surface of the second electrode on the opposite side to the substrate, and a pixel electrode provided on a surface of the second insulating film on the opposite side to the substrate. A surface formed by the surface of the second electrode on the opposite side to the substrate and a surface of the first insulating film exposed from the second electrode includes a first surface that extends from a position overlapping in a plan view with a first edge portion, which is a part of an opening edge of the first contact hole, toward the outside of the first contact hole and that is in contact with the pixel electrode, and a second surface that overlaps in a plan view with a second edge portion different to the first edge portion of the opening edge on the substrate side with respect to the first surface and that extends from the inside toward the outside of the first contact hole. Of the second insulating film, an inside section positioned inside a concave portion overlapping in a plan view with the first contact hole is connected to an outside section provided on the second surface on the outside of the concave portion.

According to the aspect of the invention, the first electrode and the second electrode are electrically connected to each other via the first contact hole formed in the first insulating film, and at the same time, the surface of the second insulating film provided on the opposite side to the substrate with respect to the second electrode is leveled and the second electrode is exposed. Thus, leveling can be performed while filling the concave portion of the first contact hole using the second insulating film, and the pixel electrode can be provided on the flat surface configured by the second insulating film and the second electrode. As a result, the concave portion caused by the first contact hole can be prevented from occurring in the surface of the pixel electrode. Further, in the surface formed by the surface of the second electrode on the opposite side to the substrate and the surface of the first insulating film exposed from the second electrode, the second surface, which overlaps in a plan view with the second edge portion that is the part of the opening edge of the first contact hole, is on the substrate side with respect to the first surface, which overlaps in a plan view with the first edge portion that is the part of the opening edge of the first contact hole. Thus, in the second insulating film, the inside section positioned inside the concave portion overlapping in a plan view with the first contact hole is connected to the outside section overlapping with the second surface. As a result, peeling of the inside section can be suppressed after the leveling of the surface of the second insulating film on the opposite side to the substrate and before the formation of the pixel electrode.

According to the aspect of the invention, the second electrode may include a first section that is positioned inside the first contact hole, and a second section that, of the first edge portion and the second edge portion, only overlaps with the first edge portion, and extends from the first section to the outside of the first contact hole. According to this aspect, a configuration can be realized in which, in the second insulating film, the inside section positioned inside the concave portion overlapping in a plan view with the first contact hole is connected to the outside section overlapping with the second surface by patterning of the second electrode.

According to the aspect of the invention, the first contact hole may include a first hole that configures a section of the first insulating film on the substrate side, and a second hole that has a larger size than the first hole and that communicates with the first hole on the opposite side to the substrate. According to this aspect, since the aspect ratio of the first contact hole can be made smaller, voids and the like can be suppressed from occurring in the second electrode and the second insulating film inside the first contact hole.

According to the aspect of the invention, a distance between an end portion of the first hole on the opposite side to the substrate, and an end portion of the second hole on the substrate side may be the same around the whole periphery of the first contact hole. According to this aspect, simply by uniformly removing an edge portion of a first opening portion of an etching mask used to form the first hole, the first opening portion can be machined to form a second opening portion used to form the second hole.

According to the aspect of the invention, in a terminal region of the substrate, the electro-optical device may include a third electrode of the same layer as the first electrode, a second contact hole penetrating the first insulating film and the second insulating film at a position overlapping in a plan view with the third electrode, and a terminal provided on a surface of the second insulating film on the opposite side to the substrate and being electrically connected to the third electrode via the second contact hole. The pixel electrode may include a first electrically conducting film, and a second electrically conducting film provided on a surface of the first electrically conducting film on the opposite side to the substrate, and the terminal may be configured by an electrically conducting film of the same layer as the second electrically conducting film. According to this aspect, after the leveling of the surface of the second insulating film on the opposite side to the substrate, a process can be performed to form the second contact hole in a state in which the second insulating film is covered by the first electrically conducting film. Thus, the peeling of the inside section can be more effectively suppressed.

According to another aspect of the invention, an electro-optical device includes a substrate, a first electrode provided on a one surface side of the substrate, a first insulating film provided on a surface of the first electrode on an opposite side to the substrate, a first contact hole penetrating the first insulating film at a position overlapping in a plan view with the first electrode, a second electrode provided on a surface of the first insulating film on the opposite side to the substrate and being electrically connected to the first electrode via the first contact hole, a second insulating film provided with a surface configuring a flat surface continuous to a surface of the second electrode on the opposite side to the substrate, and a pixel electrode provided on a surface of the second insulating film on the opposite side to the substrate. In a terminal region of the substrate, the electro-optical device includes a third electrode of the same layer as the first electrode, a second contact hole penetrating the first insulating film and the second insulating film at a position overlapping in a plan view with the third electrode, and a terminal provided on a surface of the second insulating film on the opposite side to the substrate and being electrically connected to the third electrode via the second contact hole. Of the second insulating film, an inside section positioned inside a concave portion overlapping in a plan view with the first contact hole is separated from an outside section provided on the outside of the concave portion. The pixel electrode includes a first electrically conducting film, and a second electrically conducting film provided on a surface of the first electrically conducting film on the opposite side to the substrate, and the terminal is configured by an electrically conducting film of the same layer as the second electrically conducting film. According to this aspect, after the leveling of the surface of the second insulating film on the opposite side to the substrate, a process can be performed to form the second contact hole in a state in which the second insulating film is covered by the first electrically conducting film. Thus, the peeling of the inside section can be suppressed even when the inside section and the outside section of the second insulating film are separated from each other.

According to the aspect of the invention, the electro-optical device may further include a third insulating film provided with the first electrode on a surface of the third insulating film on the opposite side to the substrate. The third insulating film may include a convex portion that protrudes to the opposite side to the substrate at a position overlapping in a plan view with the first contact hole. According to this aspect, since the aspect ratio of the first contact hole can be made smaller, voids and the like can be suppressed from occurring in the second electrode and the second insulating film inside the first contact hole.

According to yet another aspect of the invention, a manufacturing method of the electro-optical device includes forming the first insulating film, subsequently performing first etching on the first insulating film, with an etching mask including a first opening portion, provided on the surface on the opposite side to the substrate, to form the first hole, the first etching being performed through the first opening portion, performing size adjustment in which the first opening portion is enlarged to form a second opening portion of a larger size than the first opening portion, and performing second etching on the first insulating film through the second opening portion to form the second hole.

In this case, in the size adjustment, the first opening portion may be enlarged to form the second opening portion by removing a certain amount around an entire edge portion of the etching mask.

According to yet another aspect of the invention, a manufacturing method includes, forming the second insulating film and leveling the second insulating film to obtain a continuous flat surface formed by a surface of the second electrode and the surface of the second insulating film on the opposite side to the substrate, subsequently performing a first step for forming the first electrically conducting film on a display region in which the pixel electrode is provided, performing a second step for forming the second contact hole, performing a third step for forming the second electrically conducting film on the display region and the terminal region, and performing a fourth step for patterning the first electrically conducting film and the second electrically conducting film to form the pixel electrode and the terminal. According to this aspect, after the leveling of the surface of the second insulating film on the opposite side to the substrate, in the display region, the second step can be performed to form the second contact hole in a state in which the second insulating film is covered by the first electrically conducting film. Thus, the peeling of the inside section in the second step can be suppressed.

The electro-optical device according to the invention is used for a variety of electronic apparatuses. In the invention, when an electro-optical device is used for a projection-type display apparatus among electronic apparatuses, the projection-type display apparatus is provided with a light-source unit configured to emit a light to be applied to the electro-optical device, and a projection optical system configured to project light modulated by the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
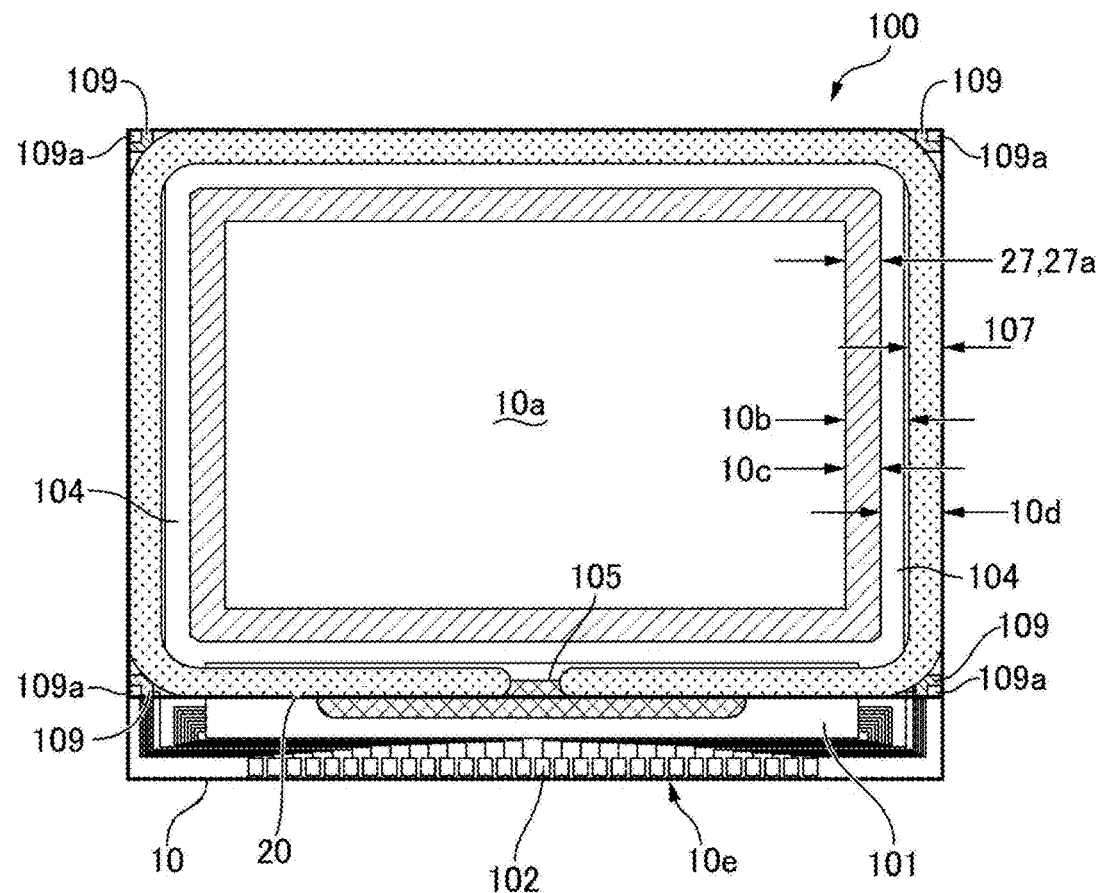
FIG. 1 is a plan view of an electro-optical device to which the invention is applied.

Exemplary embodiments of the invention will be described with reference to the drawings. Note that in the drawings referred to in the description below, to illustrate each layer or each member at a recognizable size on the drawings, each layer or each member is illustrated in a different scale. Also note that, in the description below, when describing layers formed in a first substrate 10, the upper layer side or the front surface side refer to the side opposed to the side on which the first substrate 10 is located (the side on which a counter substrate is located), and the bottom layer side refers to the side on which the first substrate 10 is located.

Configuration of Electro-Optical Device

Figure 2:
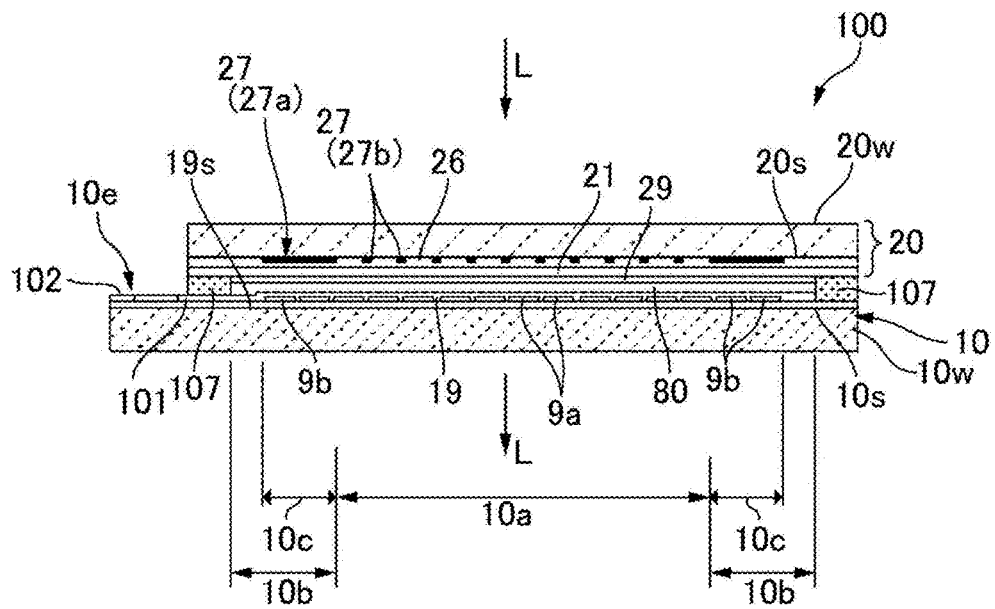
FIG. 2 is a cross-sectional view of the electro-optical device illustrated in FIG. 1.

FIG. 1 is a plan view of an electro-optical device 100 to which the invention is applied. FIG. 2 is a cross-sectional view illustrating the electro-optical device 100 illustrated in FIG. 1. As illustrated in FIG. 1 and FIG. 2, in the electro-optical device 100, a first substrate 10 and a second substrate 20 are bonded together with a sealing material 107 creating a predetermined gap, where the first substrate 10 is opposed to the second substrate 20. The sealing material 107 is provided in a frame-like shape in conformance with the outer edge of the second substrate 20. An electro-optical layer 80 such as a liquid crystal layer is provided in an area surrounded by the sealing material 107 between the first substrate 10 and the second substrate 20. Thus, the electro-optical device 100 is formed as a liquid-crystal device. The sealing material 107 is an adhesive having a photocurable property or an adhesive having both a photocurable property and a thermosetting property, and includes a gap material, such as glass fibers or glass beads, in order to maintain a distance between the two substrates at a predetermined value. The first substrate 10 and the second substrate 20 both have a quadrangle shape, and in a substantially central portion of the electro-optical panel 100, a display region 10a is provided as a quadrangle region. In accordance with such a shape, the seal material 107 is also provided in a substantially quadrangular shape, and a peripheral region 10b having a rectangular frame shape is provided between an inner peripheral edge of the seal material 107 and an outer peripheral edge of the display region 10a.

As a substrate main body, the first substrate 10 includes a transmissive substrate main body 10w, such as a quartz substrate or a glass substrate. A data-line drive circuit 101, and a terminal region 10e in which a plurality of terminals 102 are disposed are formed along one side of the first substrate 10, on a one surface 10s side on the second substrate 20 side of the first substrate 10, outside the display region 10a, and scan line drive circuits 104 are formed along the other sides adjacent to this side. A flexible wiring substrate (not illustrated) is connected to the terminals 102, and a variety of levels of potentials and signals are input to the first substrate 10 via the flexible wiring substrate.

On the one surface 10s of the first substrate 10, in the display region 10a, a plurality of transmissive pixel electrodes 9a formed of an Indium Tin Oxide (ITO) film and the like, and pixel transistors (not illustrated in FIG. 2) electrically connected to each of the plurality of pixel electrodes 9a are formed in a matrix shape. A first oriented film 19 is formed on the pixel electrodes 9a on the second substrate 20 side. The pixel electrodes 9a are covered with the first oriented film 19.

As a substrate main body, the second substrate 20 includes a transmissive substrate main body 20w, such as a quartz substrate or a glass substrate. A transmissive common electrode 21 formed of an ITO film and the like is formed on the second substrate 20, on a one surface 20s side facing the first substrate 10. A second oriented film 29 is formed on the common electrode 21 on the first substrate 10 side. The common electrode 21 is formed over substantially the entire surface of the second substrate 20, and is covered with the second oriented film 29. A light-shielding layer 27 having light-shielding properties and being formed of a resin, a metal, or a metal compound is formed on the one surface 20s side of the second substrate 20, on the opposite side of the first substrate 10 with respect to the common electrode 21, and a transmissive protective layer 26 is formed between the light-shielding layer 27 and the common electrode 21. The light-shielding layer 27 is formed, for example, as a parting edge 27a in a frame-like shape extending along the outer peripheral edge of the display region 10a. The light-shielding layer 27 is also formed as a light-shielding layer 27b (a black matrix) in a region overlapping in a plan view with a region located between the adjacent pixel electrodes 9a. In the peripheral region 10b of the first substrate 10, a dummy pixel region 9b, which is concurrently formed with the pixel electrodes 9a, is formed in the dummy pixel area 10c that overlaps in a plan view with the parting edge 27a.

The first oriented film 19 and the second oriented film 29 are inorganic oriented films (vertical oriented films) formed of an oblique deposition film of $SiO_x$ (x<2), $SiO_2$, $TiO_2$, MgO, $Al_2O_3$, and the like, where liquid crystal molecules having negative dielectric anisotropy used for the electro-optical layer 80 are disposed obliquely. Thus, the liquid crystal molecules form a predetermined angle with respect to the first substrate 10 and the second substrate 20. In this way, the electro-optical device 100 is formed as a vertical alignment (VA) mode liquid-crystal device.

In the first substrate 10, in regions that overlap with corner portions of the second substrate 20 further to the outside than the sealing material 107, inter-substrate conduction electrodes 109 are formed, in order to provide electrical conduction between the first substrate 10 and the second substrate 20. An inter-substrate conduction material 109a containing conductive particles is disposed on the inter-substrate conduction electrodes 109. The common electrode 21 of the second substrate 20 is electrically connected to the first substrate 10 side via the inter-substrate conduction material 109a and the inter-substrate conduction electrodes 109. Thus, a common potential is applied to the common electrode 21 from the first substrate 10 side.

In the electro-optical device 100 of the present exemplary embodiment, the pixel electrodes 9a and the counter electrode 21 are formed of the ITO film (a transmissive conductive film), and the electro-optical device 100 is configured as a transmissive liquid-crystal device. In the electro-optical device 100, of the first substrate 10 and the second substrate 20, light that is incident to the electro-optical layer 80 from either one of the substrates is modulated while passing through the other substrate and being emitted, and displays an image. In the exemplary embodiment, the electro-optical device 100 displays an image by the light incident from the second substrate 20 being modulated by the electro-optical layer 80 for each of the pixels while passing through the first substrate 10 and being emitted, as indicated by an arrow L.

Electrical Configuration of Electro-Optical Device 100

Figure 3:
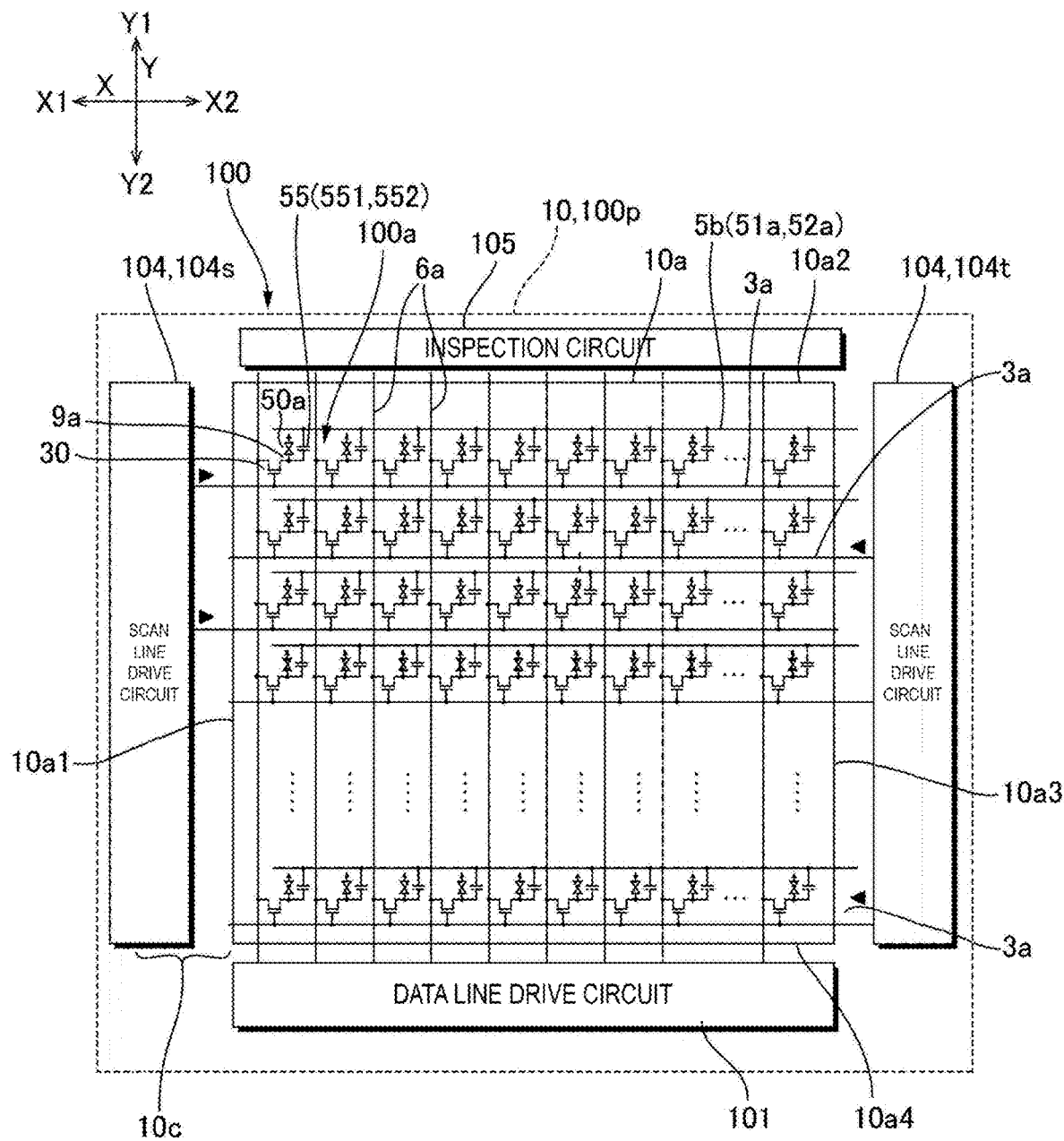
FIG. 3 is a block diagram illustrating the electrical configuration of the electro-optical panel illustrated in FIG. 1.

FIG. 3 is a block diagram illustrating the electrical configuration of the electro-optical panel 100 illustrated in FIG. 1. In FIG. 3, the electro-optical device 100 is provided with a VA mode liquid crystal panel 100p, and the liquid crystal panel 100p includes the display region 10a. A plurality of pixels 100a are arranged in a matrix pattern in a central region of the display region 10a. In the liquid crystal panel 100p, in the first substrate 10 described above with reference to FIG. 1, FIG. 2 and the like, a plurality of scan lines 3a extending in a first direction X and a plurality of data lines 6a extending in a second direction Y are formed on the inner side of the display region 10a. The plurality of pixels 100a are formed to correspond to each of intersections between the plurality of scan lines 3a and the plurality of data lines 6a. The plurality of scan lines 3a are electrically connected to the scan line drive circuits 104, and the plurality of data lines 6a are connected to the data line drive circuit 101. Further, an inspection circuit 105 is electrically connected to the plurality of data lines 6a on the opposite side to the data line drive circuit 101 in the second direction Y.

A pixel transistor 30 formed of a field effect transistor or the like, and the pixel electrode 9a that is electrically connected to the pixel transistor 30 are formed in each of the plurality of pixels 100a. The data line 6a is electrically connected to a source of the pixel transistor 30, the scan line 3a is electrically connected to a gate of the pixel transistor 30, and the pixel electrode 9a is electrically connected to a drain of the pixel transistor 30. An image signal is supplied to the data line 6a, and a scan signal is supplied to the scan line 3a. In the exemplary embodiment, the scan line drive circuits 104 are configured as a scan line drive circuit 104s and a scan line drive circuit 104t on a one side X1 and another side X2 in the X direction of the display area 10a. The scan line drive circuit 104s on the one side X1 in the X direction drives the odd-numbered scan lines 3a and the scan line drive circuit 104t on the other side X2 in the X direction drives the even-numbered scan lines 3a.

In each of the pixels 100a, the pixel electrode 9a faces the common electrode 21 of the second substrate 20 via the electro-optical layer 80, which are described above with reference to FIG. 1 and FIG. 2, so as to configure a liquid crystal capacitor 50a. A holding capacitor 55 disposed in parallel with the liquid crystal capacitor 50a is added to each pixel 100a to prevent fluctuations of the image signal held by the liquid crystal capacitor 50a. In the exemplary embodiment, capacitor lines 5b extending across the plurality of pixels 100a are formed in the substrate main body 10w so as to configure the holding capacitors 55, and the common potential is supplied to the capacitor lines 5b.

In FIG. 3, one capacitor line 5b is illustrated extending in the first direction X, but in the exemplary embodiment, the capacitor lines 5b, as described below, are configured by first capacitor lines 51a that extend in the first direction X and second capacitor lines 52a that extend in the second direction Y. Further, in FIG. 3, the one holding capacitor 55 is illustrated, but in the exemplary embodiment, as described below, the holding capacitors 55 are configured by first holding capacitors 551 formed between the first capacitor lines 51a and second holding capacitors 552 formed between the second capacitor lines 52a.

Specific Configuration of Pixel

Figure 4:
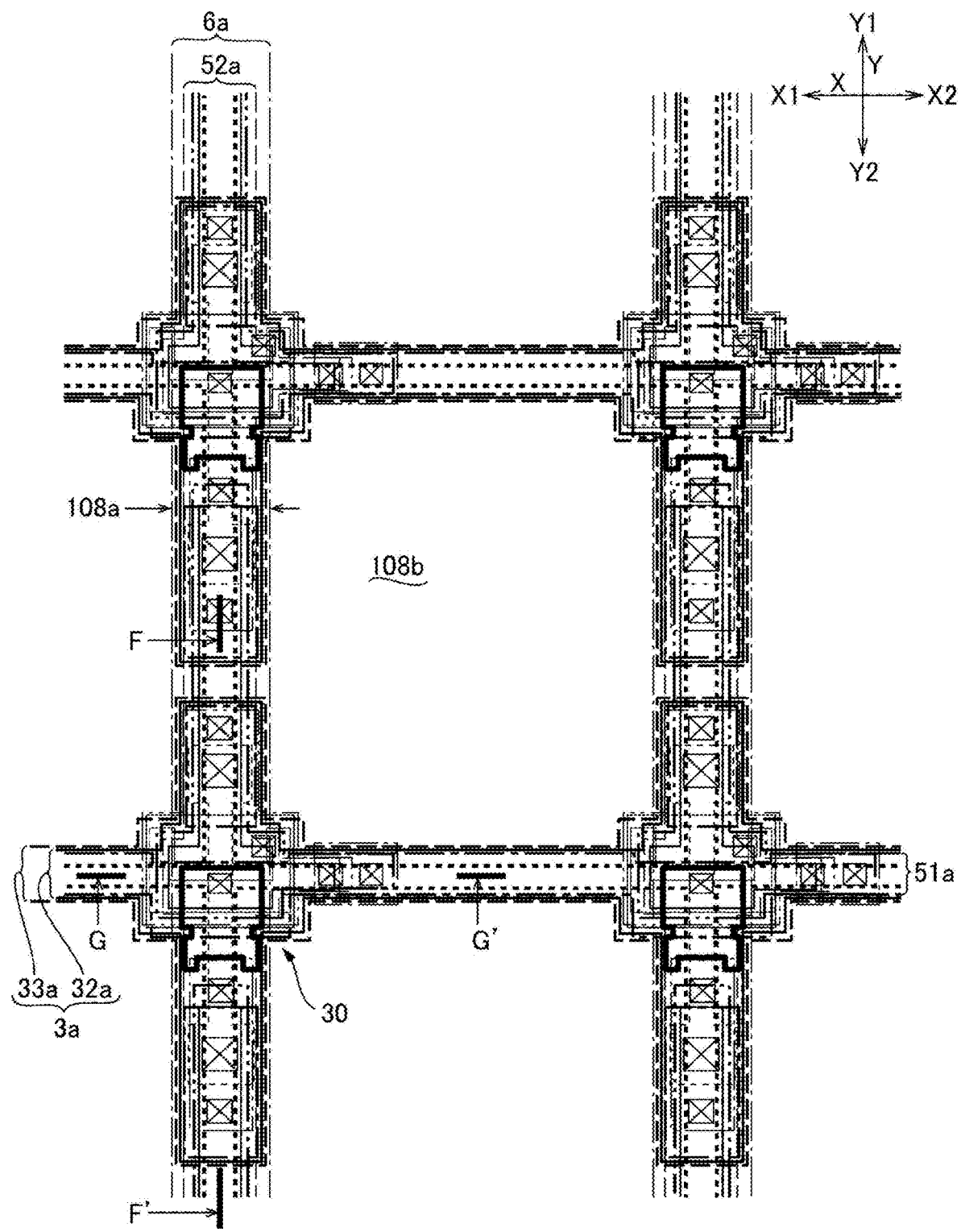
FIG. 4 is a plan view of a plurality of adjacent pixels in the electro-optical device illustrated in FIG. 1.
Figure 5:
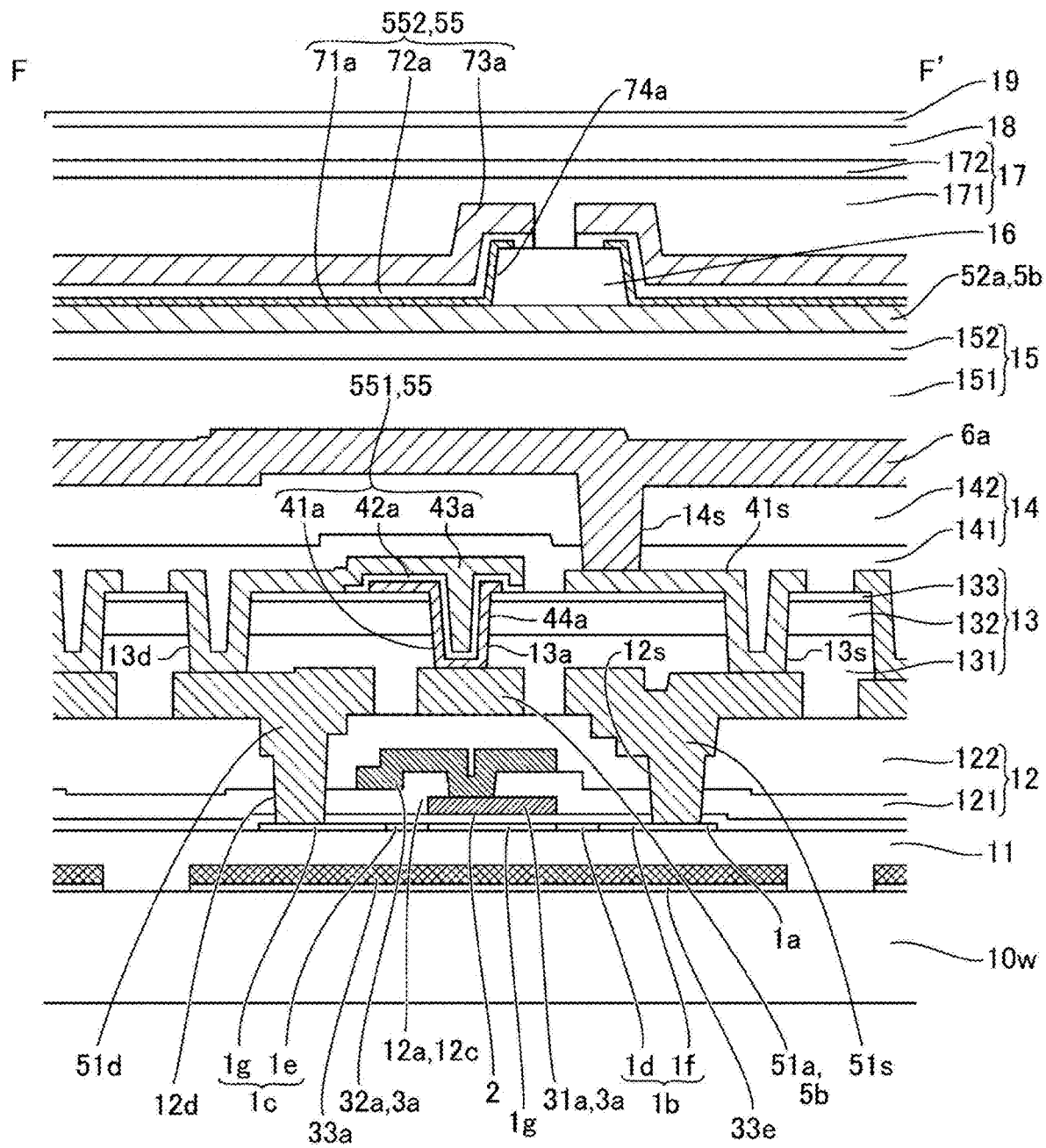
FIG. 5 is a cross-sectional view taken along F-F' of a first substrate used in the electro-optical device illustrated in FIG. 1.
Figure 6:
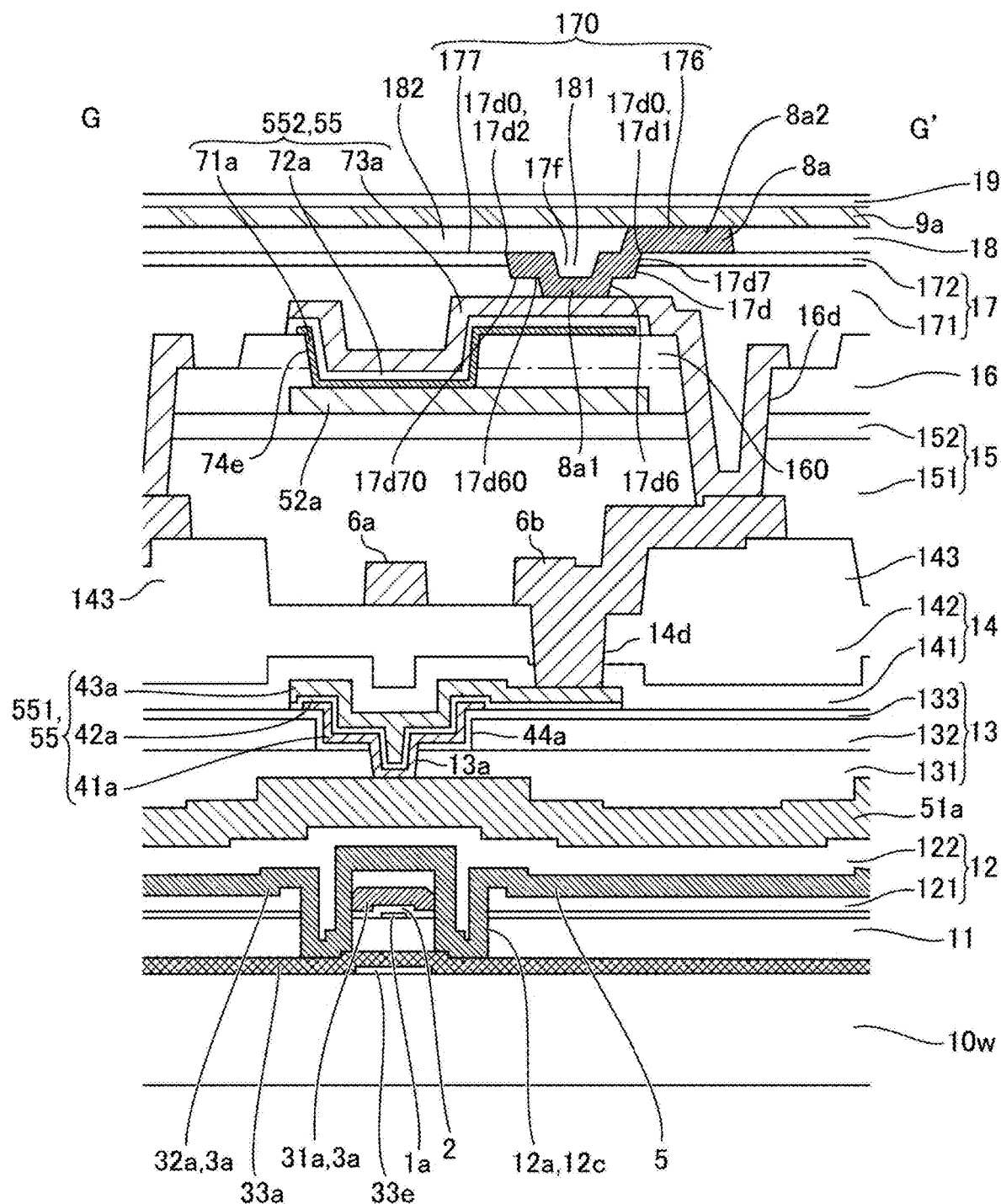
FIG. 6 is a cross-sectional view taken along G-G' of the first substrate used in the electro-optical device illustrated in FIG. 1.

FIG. 4 is a plan view of a plurality of adjacent pixels in the electro-optical device 100 illustrated in FIG. 1. FIG. 5 is a cross-sectional view taken along F-F' of the first substrate 10 used in the electro-optical device 100 illustrated in FIG. 1, and is a cross-sectional view taken along the data line 6a. FIG. 6 is a cross-sectional view taken along G-G' of the first substrate 10 used in the electro-optical device 100 illustrated in FIG. 1, and is a cross-sectional view taken along the scan line 3a. Note that FIG. 6 illustrates a state when cutting at a position passing through a first contact hole 17d with respect to the pixel electrode 9a. Note that, in FIG. 4 and FIG. 7 to FIG. 13 to be described later, layers are indicated by the lines below. Further, in FIG. 4 and FIG. 7 to FIG. 13, for the layers in which the end portions overlap in a plan view with each other, the end portions are shifted to make the shape and the like of the layers easily recognizable.

Second scan line 33a is indicated by thick dashed line

Semiconductor layer 1a is indicated by thin short dotted line

First scan line 32a is indicated by medium thickness solid line

Gate electrode 31a is indicated by thick solid line

First capacitance line 51a, source electrode 51s, and drain electrode 51d are indicated by thick one-dot chain lines First capacitor electrode 41a is indicated by thin solid line Second capacitor electrode 43a is indicated by thin two-dot chain line Data line 6a, and relay electrode 6b are indicated by thin one-dot chain lines Second capacitor line 52a is indicated by thin, long dashed line Third capacitor electrode 71a is indicated by medium thick solid line First electrode 73a is indicated by thick two-dot chain line Second electrode 8a is indicated by very thick solid line Pixel electrode 9a is indicated by thick short dotted line Contact hole is indicated by solid line As illustrated in FIG. 3, the pixel electrode 9a is formed on each of the plurality of pixels on the one surface 10s of the first substrate 10. The data line 6a and the scan line 3a (a first scan line 32a and a second scan line 33a) extend along an inter-pixel region between the adjacent pixel electrodes 9a. The scan line 3a extends in the first direction X, and the data line 6a extends in the second direction Y. The pixel transistor 30 is formed in correspondence to the intersection of the data line 6a and the scan line 3a. The first capacitor line 51a extends in the first direction X so as to overlap with the scan line 3a in a plan view, and the second capacitor line 52a extends in the second direction Y so as to overlap with the data line 6a in a plan view. The scan line 3a, the data line 6a, the first capacitor line 51a, and the second capacitor line 52a have light-shielding properties. Thus, the region in which the scan line 3a, the data line 6a, the first capacitor line 51a and the second capacitor line 52a are formed is a light-shielding region 108a through which light does not pass. The region surrounded by the light-shielding region 108a is an aperture region 108b through which light passes (a transmissive region).

As illustrated in FIG. 5 and FIG. 6, the second scan line 33a, a semiconductor layer 1a, a gate insulating layer 2, a gate electrode 31a, the first scan line 32a, the first capacitor line 51a, the first capacitor electrode 41a, a first dielectric layer 42a, the second capacitor electrode 43a, the data line 6a, the second capacitor line 52a, a third capacitor electrode 71a, a second dielectric layer 72a, a first electrode 73a, a second electrode 8a, and the pixel electrode 9a are laminated in this order on the one surface 10s side of the first substrate 10.

An interlayer insulating film 11 is formed between the second scan line 33a and the semiconductor layer 1a, and an interlayer insulating film 12 is formed between the gate electrode 31a and the first capacitor line 51a. An interlayer insulating film 13 is formed between the first capacitor line 51a and the first capacitor electrode 41a, and an interlayer insulating film 14 is formed between the second capacitor electrode 43a and the data line 6a. An interlayer insulating film 15 is formed between the data line 6a and the second capacitor line 52a, and an interlayer insulating film (a third insulating film) is formed between the second capacitor line 52a and the third capacitor electrode 71a. A first insulating film 17 (an interlayer insulating film) is formed between the first electrode 73a and the second electrode 8a, and a second insulating film 18 (a leveling film) is formed between the first insulating film 17 and the pixel electrode 9a. The interlayer insulating films 11 to 16, the first insulating film 17, and the second insulating film 18 are all transmissive insulating films.

Leveling processing, such as CMP processing, is performed on the surface of the interlayer insulating film 11 on the pixel electrode 9a side, the surface being a flat surface. The interlayer insulating film 12 is a laminated film formed of interlayer insulating films 121 and 122. The interlayer insulating film 13 is a laminated film formed of interlayer insulating films 131, 132, and 133. The surface of the interlayer insulating film 131 on the pixel electrode 9a side is a flat surface, as a result of leveling processing, such as CMP processing. The interlayer insulating film 14 is a laminated film formed of interlayer insulating films 141 and 142. The interlayer insulating film 15 is a laminated film formed of interlayer insulating films 151 and 152. The surface of the interlayer insulating film 151 on the pixel electrode 9a side is a flat surface, as a result of leveling processing, such as CMP processing.

The first insulating film 17 is a laminated film formed of an insulating film 171 made of a silicone oxide film or the like, and an insulating film 172 made of boron-containing silicate glass or the like. The surface of the first insulating film 17 on the pixel electrode 9a side is a flat surface, as a result of leveling processing, such as CMP processing. The second insulating film 18 is made of boron-containing silicate glass or the like. The surface of the second insulating film 18 on the pixel electrode 9a side is a flat surface, as a result of leveling processing, such as CMP processing.

Detailed Description of Each Layer

Figure 7:
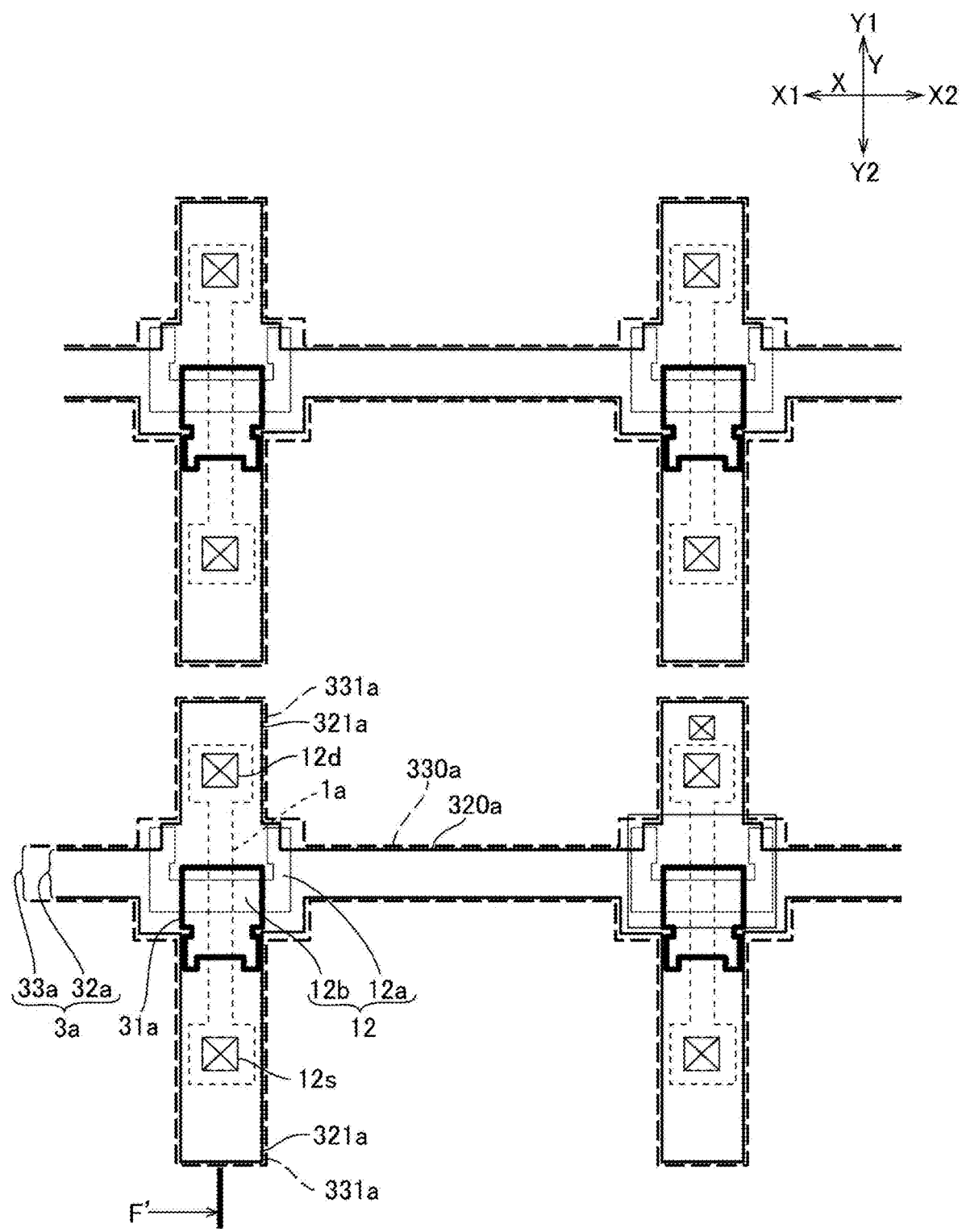
FIG. 7 is a plan view of scan lines, semiconductor layers, gate electrodes, and the like illustrated in FIG. 5 and FIG. 6.
Figure 8:
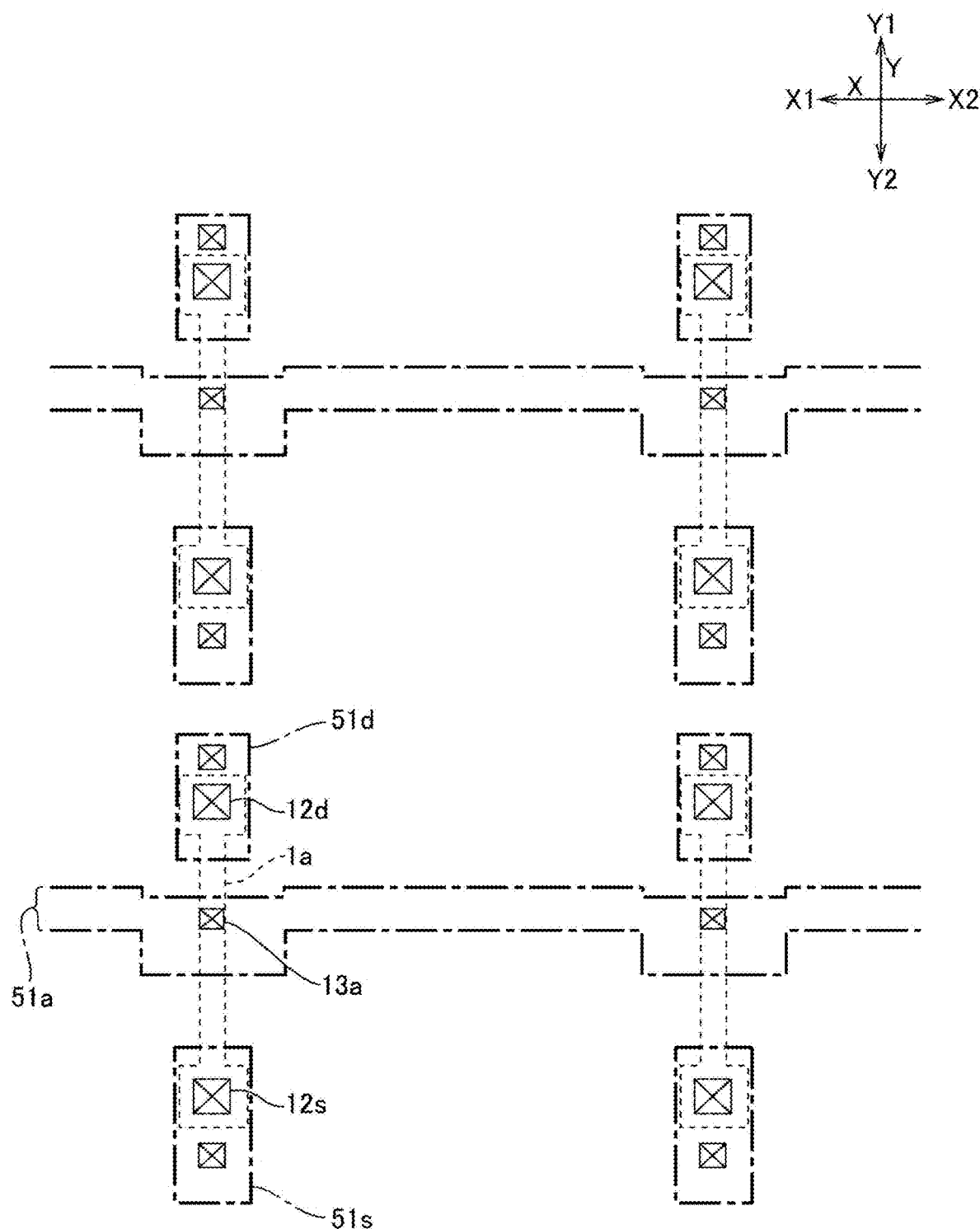
FIG. 8 is a plan view of first capacitor lines, source electrodes, drain electrodes, and the like illustrated in FIG. 5 and FIG. 6.
Figure 9:
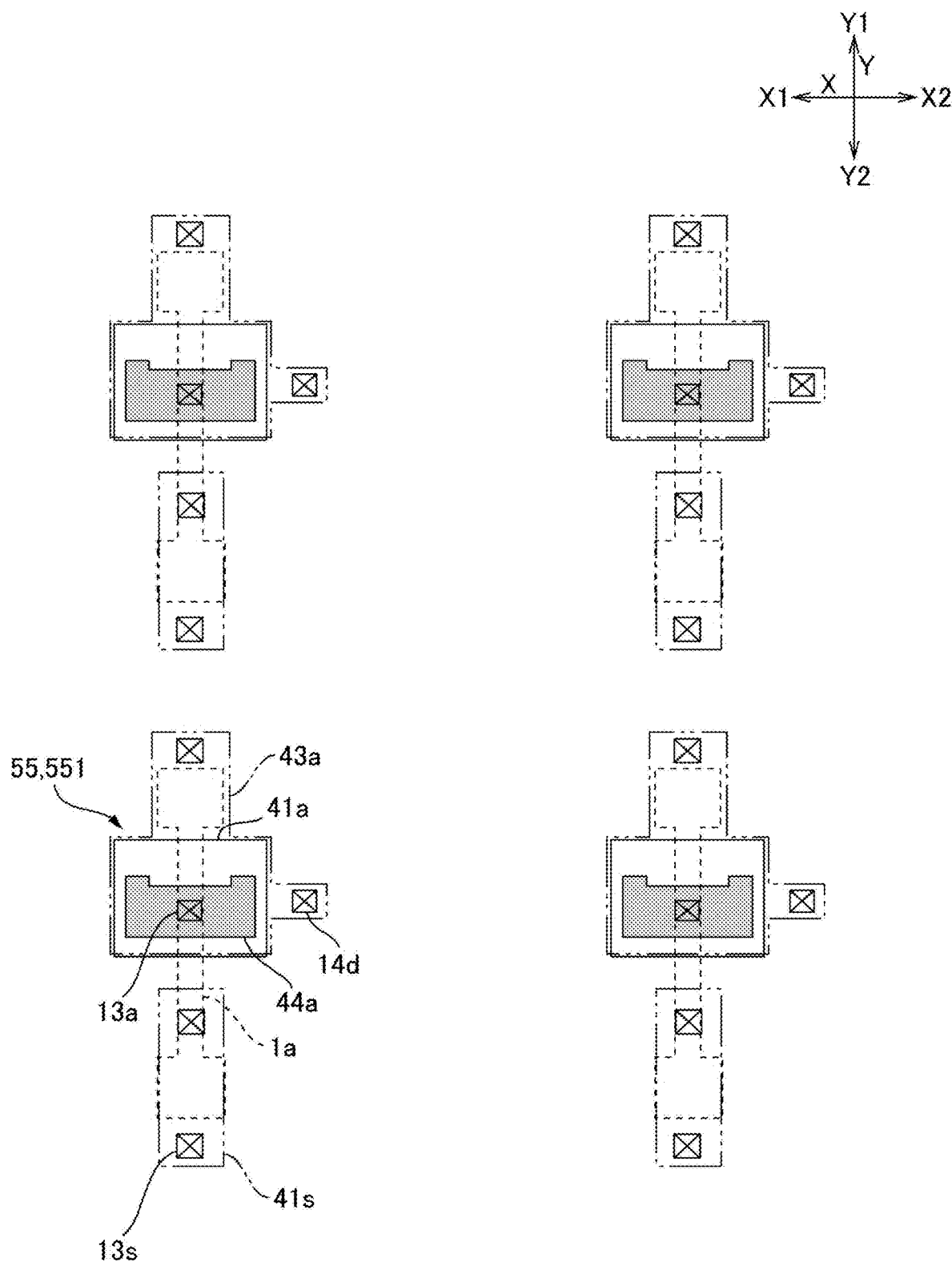
FIG. 9 is a plan view of first capacitor electrodes, second capacitor electrodes, and the like illustrated in FIG. 5 and FIG. 6.
Figure 10:
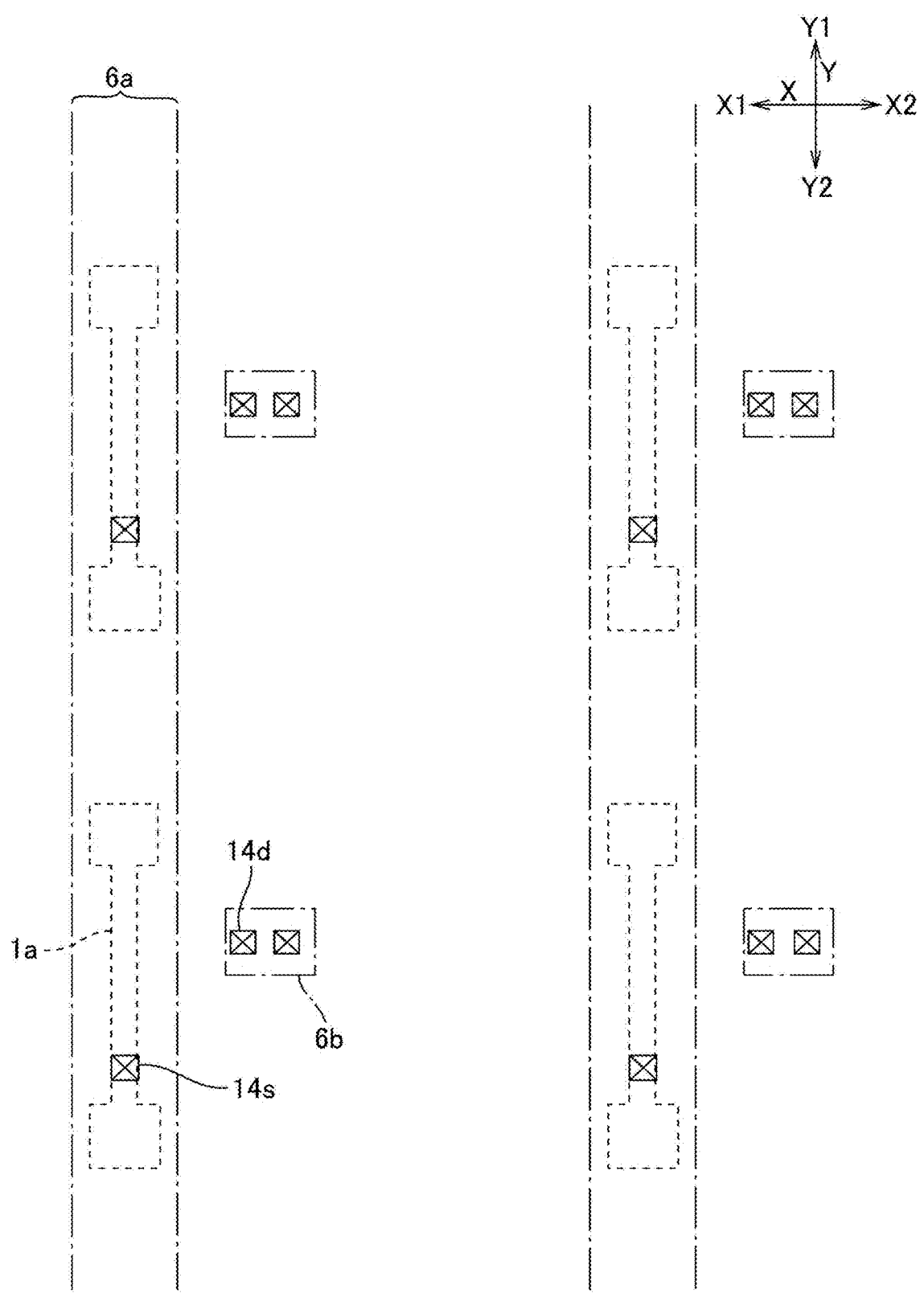
FIG. 10 is a plan view of data lines, relay electrodes, and the like illustrated in FIG. 5 and FIG. 6.
Figure 11:
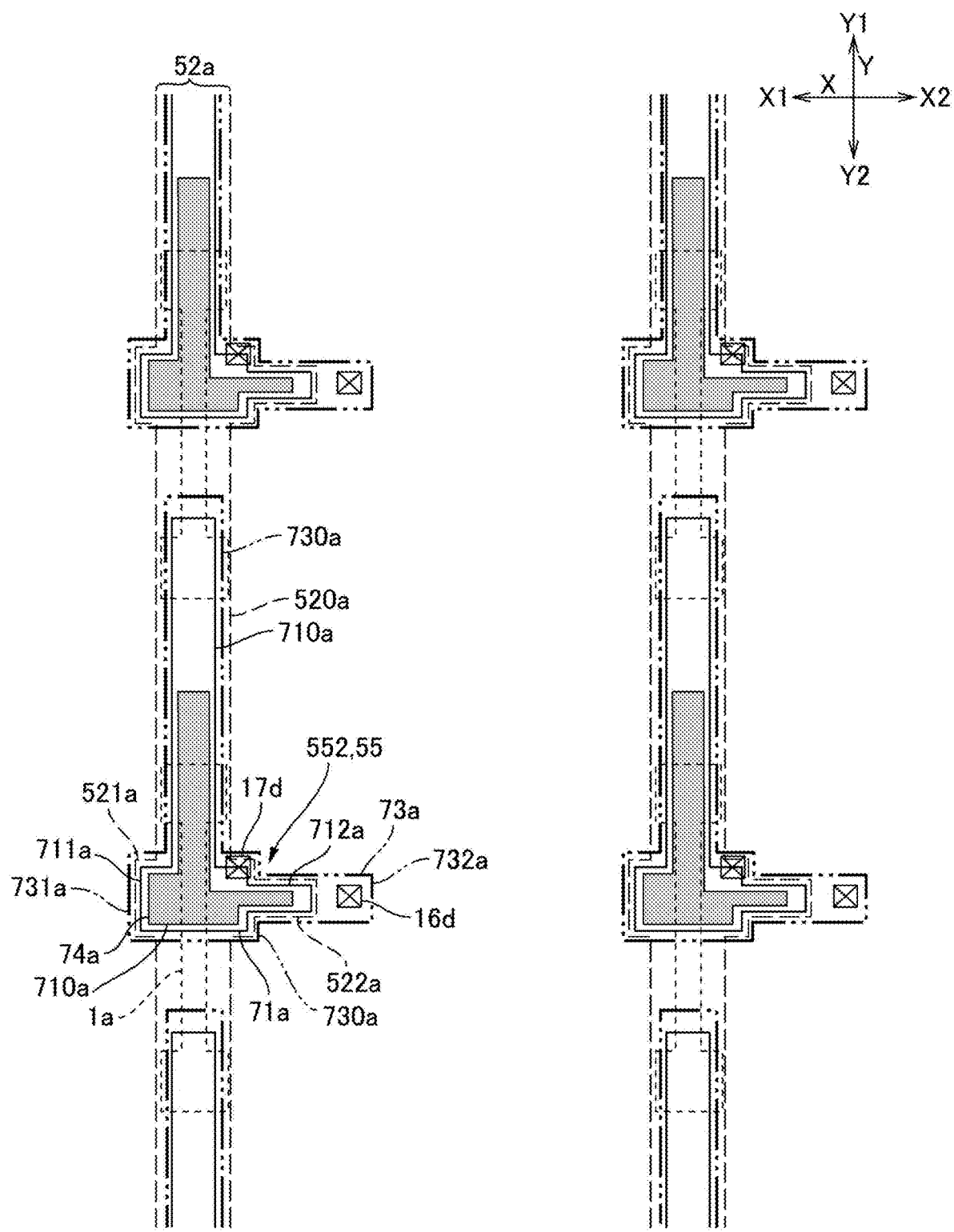
FIG. 11 is a plan view of second capacitor lines, third capacitor electrodes, first electrodes, and the like illustrated in FIG. 5 and FIG. 6.
Figure 12:
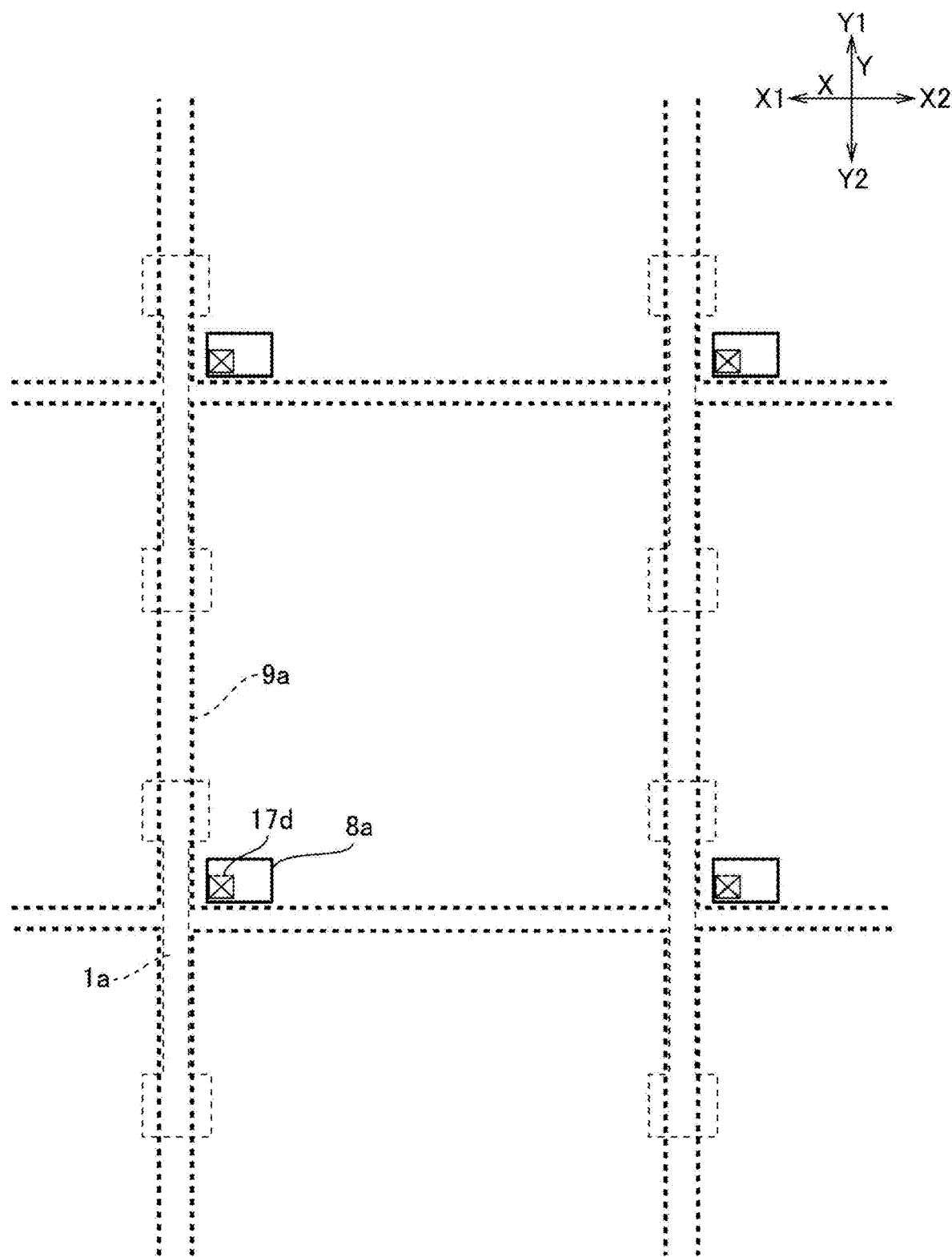
FIG. 12 is a plan view of pixel electrodes and second electrodes illustrated in FIG. 5 and FIG. 6.

A detailed configuration of the first substrate 10 will be described with reference FIG. 5 and FIG. 6, while referring to FIG. 7 to FIG. 13 described below as necessary. FIG. 7 is a plan view of the scan lines 3a, the semiconductor layers 1a, the gate electrodes 31a, and the like illustrated in FIG. 5 and FIG. 6. FIG. 8 is a plan view of the first capacitance lines 51a, the source electrodes 51s, the drain electrodes 51d, and the like illustrated in FIG. 5 and FIG. 6. FIG. 9 is a plan view of the first capacitance electrodes 41a, the second capacitance electrodes 43a, and the like illustrated in FIG. 5 and FIG. 6. FIG. 10 is a plan view of the data lines 6a, the relay electrodes 6b, and the like illustrated in FIG. 5 and FIG. 6. FIG. 11 is a plan view of the second capacitance lines 52a, the third capacitance electrodes 71a, the first electrodes 73a, and the like illustrated in FIG. 5 and FIG. 6. FIG. 12 is a plan view of the pixel electrodes 9a and the second electrodes 8a illustrated in FIG. 5 and FIG. 6. FIG.

13 is a plan view of the second scan lines 33a and the like illustrated in FIG. 5 and FIG. 6. In FIG. 7 to FIG. 13, the contact holes used for the electrical connections of the electrodes and the like illustrated in FIG. 5 and FIG. 6 are illustrated, and at the same time, the semiconductor layers 1a are illustrated for the purpose of illustrating positions used as reference.

First, as illustrated in FIG. 5, FIG. 6, and FIG. 7, the second scan line 33a having light-shielding properties and extending in the first direction X is formed between the first substrate 10 and the semiconductor layer 1a, and the interlayer insulating film 11 is formed between the semiconductor layer 1a and the second scan line 33a. The second scan line 33a includes a main line section 330a that extends in the first X direction, and protruding portions 331a and 332a that protrude to both sides from the main line section 330a along the data line 6a in the second direction Y.

The semiconductor layer 1a of the pixel transistor 30 is formed on the surface of the interlayer insulating film 11 on the pixel electrode 9a side, and the semiconductor layer 1a is covered with the gate insulating layer 2 from the pixel electrode 9a side. The semiconductor layer 1a is configured by a polysilicon film (a polycrystalline silicon film) or the like, and the lengthwise direction of the semiconductor layer 1a is set in the extending direction of the data line 6a. The gate insulating layer 2 has a two-layer structure including a first gate insulating layer including a silicon oxide film that is obtained by thermally oxidizing the semiconductor layer 1a, and a second gate insulating layer including a silicon oxide film that is formed by the low pressure CVD method and the like.

The gate electrode 31a having light-shielding properties is formed on the surface of the gate insulating layer 2 on the pixel electrode 9a side. The first scan line 32a extends in the first direction X between the semiconductor layer 1a and the interlayer insulating film 12, and is electrically connected to the gate electrode 31a. The first scan line 32a is formed by a light-shielding layer. The first scan line 32a includes a main line section 320a that extends in the first direction X, and protruding portions 321a and 322a that protrude to both sides from the main line section 320a along the data line 6a in the second direction Y. The gate electrode 31a is provided between the lower layer interlayer insulating film 121 of the interlayer insulating film 12 and the semiconductor layer 1a, and the first scan line 32a is formed between the interlayer insulating film 121 and the interlayer insulating film 122 of the interlayer insulating film 12.

The gate electrode 31a overlaps with a central section in the lengthwise direction of the semiconductor layer 1a. The semiconductor layer 1a is provided with a channel region 1i that faces the gate electrode 31a via the gate insulating layer 2, and the channel region 1i is provided on both sides with a source region 1b and a drain region 1c. The pixel transistor 30 has an LDD structure. Thus, the source region 1b and the drain region 1c respectively have low concentration regions 1d and 1e at both sides of the channel region 1i, and respectively have high concentration regions 1f and 1g in regions adjacent to the low concentration regions on the opposite side to the channel region 1i.

A contact hole 12a (a first contact hole) is formed in the interlayer insulating film 121 and the interlayer insulating film 11. The contact hole 12a penetrates the interlayer insulating film 121 and the interlayer insulating film 11 and electrically connects the first scan line 32a and the second scan line 33a. A contact hole 12b is formed in the interlayer insulating film 121. The contact hole 12b penetrates the interlayer insulating film 121 and electrically connects the first scan line 32a and the gate electrode 31a. In the exemplary embodiment, the contact hole 12a and the contact hole 12b are connected in a plan view, and integrally configure a contact hole 12c.

As illustrated in FIG. 5, FIG. 6, and FIG. 8, the first capacitor line 51a, which has light-shielding properties and overlaps with the gate electrode 31a in a plan view, is formed on the surface of the interlayer insulating film 12 on the pixel electrode 9a side. The common potential is applied to the first capacitor line 51a. The first capacitor line 51a extends in the first direction X, and overlaps with the first scan line 32a in a plan view. The source electrode 51s and the drain electrode 51d are formed in positions separated from the first capacitor line 51a in the second direction Y, on the surface of the interlayer insulating film 12 on the pixel electrode 9a side. The source electrode 51s and the drain electrode 51d are configured by the same electrically conducting layer as the first capacitor line 51a. The source electrode 51s and the drain electrode 51d are each electrically connected to a source region 1b and a drain region 1c via contact holes 12s and 12d that penetrate the interlayer insulating film 12.

As illustrated in FIG. 5, FIG. 6, and FIG. 9, a first concave portion 44a, which overlaps with the first capacitor line 51a in a plan view, is formed on the surface of the interlayer insulating film 13 on the pixel electrode 9a side. The first capacitor electrode 41a, which extends from a bottom portion of the first concave portion 44a to the surface of the interlayer insulating film 13 on the pixel electrode 9a side and which has light-shielding properties, and the second capacitor electrode 43a, which overlaps with the first capacitor electrode 41a from the pixel electrode 9a side and which has light-shielding properties, are formed in a region overlapping with the first concave portion 44a. The second capacitor electrode 43a is electrically connected to the drain electrode 51d and the pixel electrode 9a.

The first capacitor electrode 41a is electrically connected to the first capacitor line 51a at the bottom portion of the first concave portion 44a. More specifically, a contact hole 13a that penetrates the interlayer insulating film 13 is formed at the bottom portion of the first concave portion 44a, and the first capacitor electrode 41a is electrically connected to the first capacitor line 51a via the contact hole 13a. The first dielectric layer 42a is formed between the first capacitor electrode 41a and the second capacitor electrode 43a, and a first holding capacitor 551 of the holding capacitor 55 is configured by the first capacitor electrode 41a, the first dielectric layer 42a, and the second capacitor electrode 43a.

A relay electrode 41s is formed in a position separated from the first capacitor electrode 41a in the second direction Y, on the surface of the interlayer insulating film 13 on the pixel electrode 9a side, so as to overlap with the source electrode 51s in a plan view. The relay electrode 41s is configured by the same electrically conducting layer as the first capacitor electrode 41a. The relay electrode 41s is electrically connected to the source electrode 51s via a contact hole 13s that penetrates the interlayer insulating film 13. The second capacitor electrode 43a is electrically connected to the drain electrode 51d via a contact hole 13d that penetrates the interlayer insulating film 13.

As illustrated in FIG. 5, FIG. 6, and FIG. 10, the data line 6a having light-shielding properties is formed so as to extend in the second direction Y on the surface of the interlayer insulating film 14 on the pixel electrode 9a side. The data line 6a is electrically connected to the relay electrode 41s via a contact hole 14s that penetrates the interlayer insulating film 14. Thus, the data line 6a is electrically connected to the source region 1*b* via the relay electrode 41*s* and the drain electrode 51*s*.

A relay electrode 6*b* is formed in a position separated from the data line 6*a* on the other side X2 in the first direction X, so as to overlap with the second capacitor electrode 43*a* in a plan view. The relay electrode 6*b* is electrically connected to the second capacitor electrode 43*a* via a contact hole 14*d* that penetrates the interlayer insulating film 14. The relay electrode 6*b* is configured by the same electrically conducting layer as the data line 6*a*.

As illustrated in FIG. 5, FIG. 6, and FIG. 11, the second capacitor line 52*a*, which has light-shielding properties and extends in the second direction Y so as to overlap with the data line 6*a* in a plan view, is formed on the surface of the interlayer insulating film 15 on the pixel electrode 9*a* side. The common potential is applied to the second capacitor line 52*a*. A second concave portion 74*a*, which is formed by a through hole that overlaps with the second capacitor line 52*a* in a plan view, is formed in the interlayer insulating film 16. The third capacitor electrode 71*a*, which extends from a bottom portion of the second concave portion 74*a* to the surface of the interlayer insulating film 16 on the pixel electrode 9*a* side and which has light-shielding properties, and the first electrode 73*a*, which overlaps with the third capacitor electrode 71*a* from the pixel electrode 9*a* side, are formed in a region overlapping with the second concave portion 74*a*. The second capacitor line 52*a* includes a main body section 520*a* that extends in the second direction Y along the data line 6*a*, and protruding portions 521*a* and 522*a* that protrude from the main body section 520*a* to the one side X1 and the other side X2 in the first direction X. The third capacitor electrode 71*a* and the first electrode 73*a* respectively include a main body section 710*a* and 730*a* that extend to a one side Y1 in the second direction Y along the data line 6*a*, and protruding portions 711*a*, 712*a*, 731*a*, and 732*a* that protrude from the main body sections 710*a* and 730*a* to the one side X1 and the other side X2 in the first direction X. The second concave portion 74*a* extends to the one side Y1 in the second direction Y. The first electrode 73*a* is electrically connected to the relay electrode 6*b* via a contact hole 16*d* that penetrates the interlayer insulating films 15 and 16.

A convex portion 143 that protrudes to the side of the pixel electrode 9*a* is formed on the interlayer insulating film 14 in a region that overlaps with the contact hole 16*d* in a plan view. Thus, a film thickness of a section of the interlayer insulating film 16 in which the contact hole 16*d* is formed is thinner than a surrounding area. The aspect ratio of the contact hole 16*d* can thus be reduced, and the first electrode 73*a* can be electrically connected to the relay electrode 6*b* in an appropriate manner. Such a mode can be realized, for example, by forming the interlayer insulating film 15, and then making the interlayer insulating film 15, apart from the section in which the contact hole 16*d* is formed, thinner using etching or the like.

The third capacitor electrode 71*a* is electrically connected to the second capacitor line 52*a* at the bottom portion of the second concave portion 74*a*. The second dielectric layer 72*a* is formed between the third capacitor electrode 71*a* and the first electrode 73*a*, and a second holding capacitor 552 of the holding capacitor 55 is configured by the third capacitor electrode 71*a*, the second dielectric layer 72*a*, and the first electrode 73*a*.

As illustrated in FIG. 5, FIG. 6, and FIG. 12, the pixel electrode 9*a* is formed on the surface, of the second insulating film 18, that is opposite to the first substrate 10. As described below, the pixel electrode 9*a* is electrically connected to the first electrode 73*a*, using the first contact hole 17*d* that penetrates the first insulating film 17 at a position overlapping with the first electrode 73*a* in a plan view, and the second electrode 8*a*. Thus, the pixel electrode 9*a* is electrically connected to the drain region 1*c* via the second electrode 8*a*, the first electrode 73*a*, the relay electrode 6*b*, the second capacitor electrode 43*a*, and the drain electrode 51*d*.

A convex portion 160 that protrudes to the opposite side to the first substrate 10 is formed at a position that overlaps with the first contact hole 17*d* in a plan view, on the interlayer insulating film 16 (the third insulating film) on which the first electrode 73*a* is provided on the surface opposite to the first substrate 10. Thus, the depth of the first contact hole 17*d* can be made shallower. For example, the convex portion 160 can be realized by forming the interlayer insulating film 16, and then making the interlayer insulating film 16, apart from the section in which the first contact hole 17*d* is formed, thinner using etching or the like.

Figure 13:
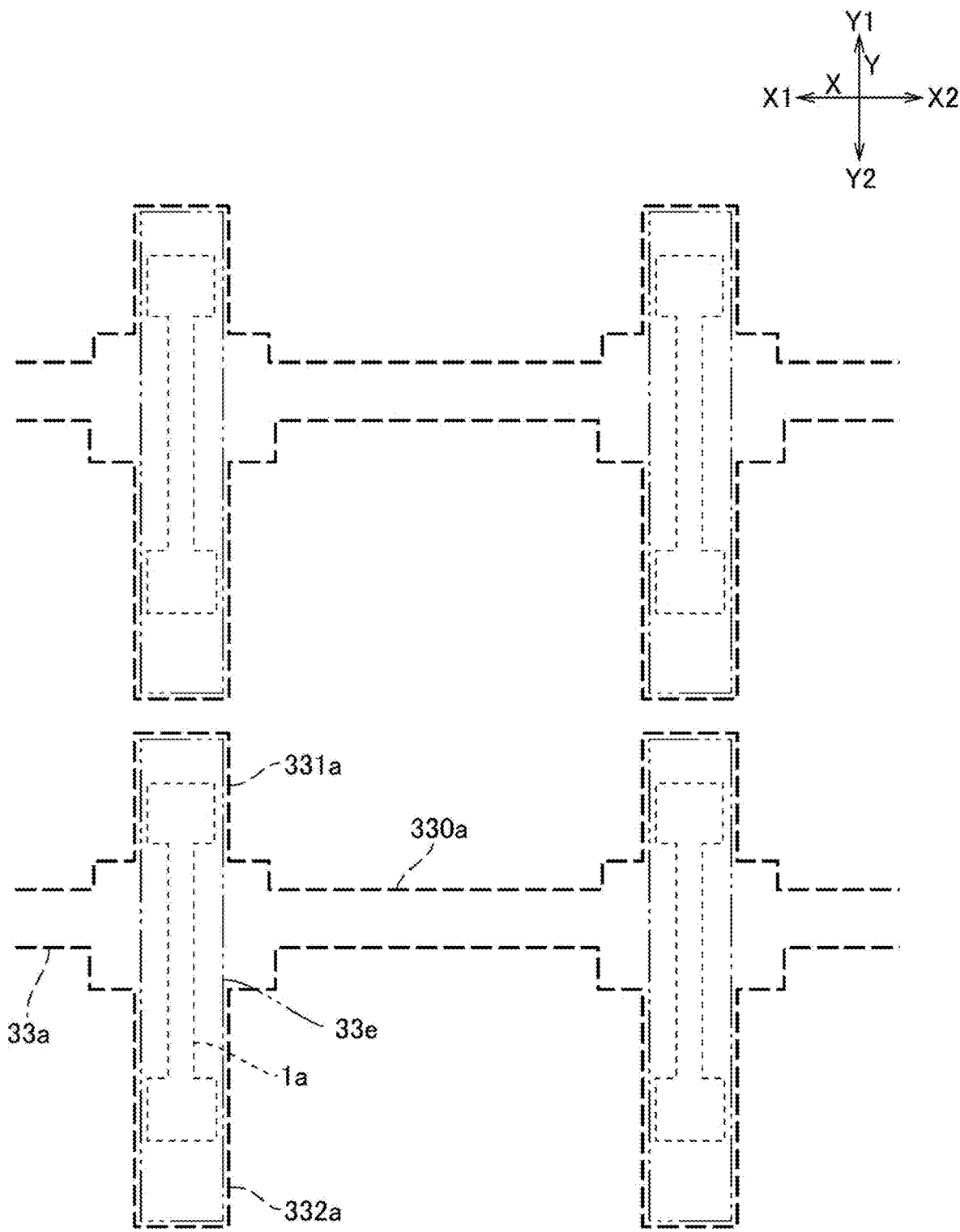
FIG. 13 is a plan view of second scan lines and the like illustrated in FIG. 5 and FIG. 6.

As illustrated in FIG. 5, FIG. 6, and FIG. 13, a light-shielding layer 33*e* is formed between the second scan line 33*a* and the first substrate 10 so as to overlap with the semiconductor layer 1*a* in a plan view. In the exemplary embodiment, the light-shielding layer 33*e* extends in the second direction Y so as to overlap with the semiconductor layer 1*a* in a plan view. Thus, the light-shielding properties of the second scan line 33*a* with respect to the semiconductor layer 1*a* are high.

Connection Structure of Pixel Electrode 9*a*

Figure 14A:
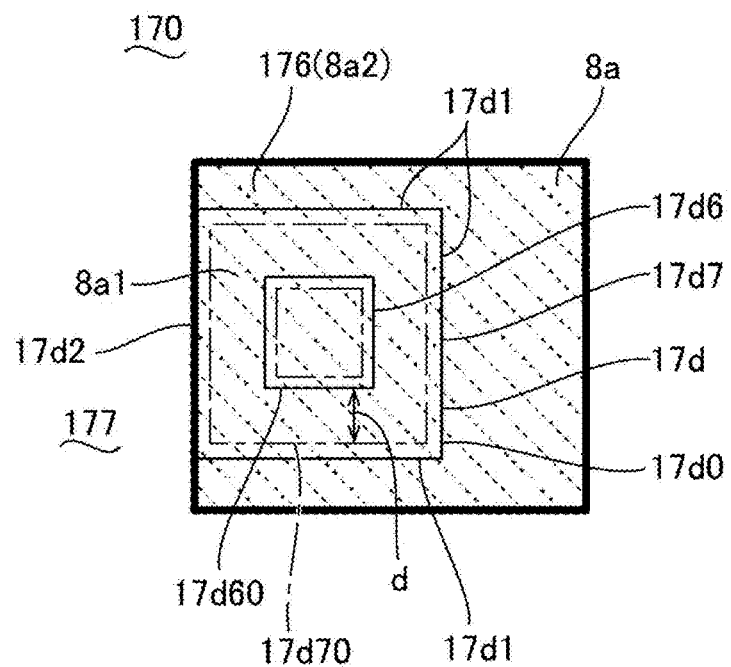
FIG. 14A and FIG. 14B are explanatory views illustrating a planar configuration of a first contact hole and the like illustrated in FIG. 6.
Figure 14B:
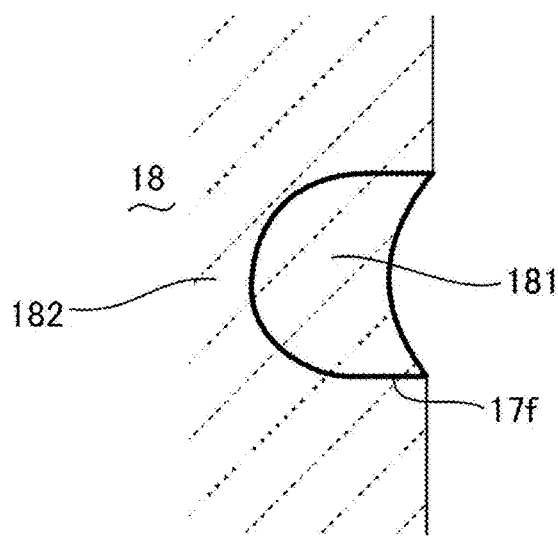

FIG. 14A and FIG. 14B are explanatory views illustrating a planar configuration of the first contact hole 17*d* and the like illustrated in FIG. 6. FIG. 14A is an explanatory view illustrating positions and the like of stepped portions inside the first contact hole 17*d*, and FIG. 14B is an explanatory view illustrating a concave portion 17*f* formed in a surface 170. As illustrated in FIG. 6, FIG. 11, and FIG. 12, in the exemplary embodiment, when the first contact hole 17*d* is used to electrically connect the first electrode 73*a* and the pixel electrode 9*a*, the second electrode 8*a* is formed on the surface of the first insulating film 17 on the opposite side to the first substrate 10, and the second electrode 8*a* is electrically connected to the first electrode 73*a* via the first contact hole 17*d*. In the exemplary embodiment, the second electrode 8*a* is a thin electrically conducting film with a thickness of approximately 300 nm, and in the exemplary embodiment, the second electrode 8*a* is formed by a titanium nitride film.

Further, the second insulating film 18 is formed on the surface of the first insulating film 17 on the opposite side to the first substrate 10, and the second insulating film 18 is a leveling film. Thus, the surface of the second insulating film 18 on the opposite side to the first substrate 10 configures a flat surface that is continuous with the surface of the second electrode 8*a* on the opposite side to the first substrate 10, and the pixel electrode 9*a* is provided on this flat surface. Thus, on the flat surface on which the second insulating film 18 and the second electrode 8*a* are formed, the pixel electrode 9*a* is electrically connected to a section of the second electrode 8*a* that is exposed from the second insulating film 18. According to this configuration, a concave portion caused by the first contact hole 17*d* in the surface of the pixel electrode 9*a* on the opposite side to the first substrate 10 does not occur. Thus, the first oriented film 19 can be appropriately formed, and as a result, the liquid crystal molecules used in the electro-optical layer 80 can be appropriately oriented.

In the exemplary embodiment, the surface 170, which is formed by the surface of the second electrode 8a on the opposite side to the first substrate 10 and the surface of the first insulating film 17 exposed from the second electrode 8a, includes a first surface 176 and a second surface 177 for which distances (heights) from the first substrate 10 are different. The first surface 176 extends from a position that overlaps in a plan view with a first edge portion 17d1 that is a part of an opening edge 17d0 of the first contact hole 17d toward the outside of the first contact hole 17d, and is in contact with the pixel electrode 9a. The second surface 177 extends from the inside toward the outside of the first contact hole 17d through a region that overlaps in a plan view with a second edge portion 17d2 that is a different part of the opening edge 17d0 than the first edge portion 17d1. The second surface 177 is positioned further to the first substrate 10 side than the first surface 176. Thus, of the second insulating film 18, an inside section 181 positioned inside a concave portion 17f that overlaps in a plan view with the first contact hole 17d is connected to an outside section 182 provided on the second surface 177 on the outside of the concave portion 17f.

In the exemplary embodiment, as illustrated in FIG. 6 and FIG. 14A, the second electrode 8a is provided with a first section 8a1 that is positioned inside the first contact hole 17d, and a second section 8a2 that extends from the first section 8a1 to the outside of the first contact hole 17d so as to overlap only with the first edge portion 17d1, of the first edge portion 17d1 and the second edge portion 17d2 and that forms the first surface 176. As a result, the second electrode 8a does not include a section overlapping from the second edge portion 17d2 and extending from the first section 8a1 to the outside of the first contact hole 17d. Thus, of the surface of the first insulating film 17 on the opposite side to the first substrate 10, the second surface 177 is configured by a section exposed from the second electrode 8a and a surface of the first section 8a1 on the opposite side to the first substrate 10. As a result, the second surface 177 is positioned closer to the first substrate 10 than the first surface 176, by an amount corresponding to the thickness of the second electrode 8a. Thus, of the second insulating film 18, the inside section 181 positioned inside a concave portion 17f that overlaps in a plan view with the first contact hole 17d is connected to the outside section 182 provided on the second surface 177. In other words, as illustrated in FIG. 14B, the concave portion 17f caused by the first contact hole 17d occurs in the surface 170 formed by the surface of the second electrode 8a on the opposite side to the first substrate 10 and the surface of the first insulating film 17 exposed from the second electrode 8a, but of the second insulating film 18, the inside section 181 positioned inside the concave portion 17f that overlaps in a plan view with the first contact hole 17d is connected to the outside section 182 provided on the second surface 177 on the outside of the concave portion 17f. In the exemplary embodiment, the first section 8a1 is provided over both a first hole 17d6 and a second hole 17d7.

In the exemplary embodiment, as illustrated in FIG. 6 and FIG. 14A, the first hole 17d6 that configures a section of the first insulating film 17 on the first substrate 10 side and the second hole 17d7 that is communicated with the first hole 17d6 on the opposite side to the first substrate 10 are provided in the first contact hole 17d, and the size of the second hole 17d7 is larger than the size of the first hole 17d6. As a result, the same effects are obtained as a configuration in which the aspect ratio of the first contact hole 17d is made smaller. Thus, the second electrode 8a can be formed appropriately inside the first contact hole 17d, and at the same time, voids and the like can be suppressed from occurring in the second insulating film 18 inside the first contact hole 17d. Further, the convex portion 160 that protrudes to the opposite side to the first substrate 10 is formed in the position that overlaps with the first contact hole 17d in a plan view, on the interlayer insulating film 16 (the third insulating film). Thus, the depth of the first contact hole 17d can be made shallower. With this configuration also, since the aspect ratio of the first contact hole 17d can be made smaller, the second electrode 8a can be formed appropriately inside the first contact hole 17d, and at the same time, voids and the like can be suppressed from occurring in the second insulating film 18 inside the first contact hole 17d.

In the connection structure configured in this manner, of the second insulating film 18, the inside section 181 positioned inside the concave portion 17f, and the outside section 182 provided on the outside of the concave portion 17f are connected together, and thus, the surface area of the second insulating film 18 is large. Thus, the second insulating film 18 has a strong bonding strength on the first substrate 10 side (a base layer side), and does not easily peel off. As a result, as described below with reference to FIG. 16, peeling of the inside section 181 positioned inside the concave portion 17f can be suppressed after the surface of the second insulating film 18 has been leveled, and before the formation of the pixel electrode 9a.

In particular, the outside section 182 is in contact with the first insulating film 17. Moreover, of the first insulating film 17, the insulating film 172 that is in contact with the outside section 182 is made of the same boron-containing silicate glass as the second insulating film 18. As a result, the second insulating film 18 has a strong bonding strength on the first substrate 10 side (the base layer side), and does not easily peel off.

Manufacturing Method

Figure 15:
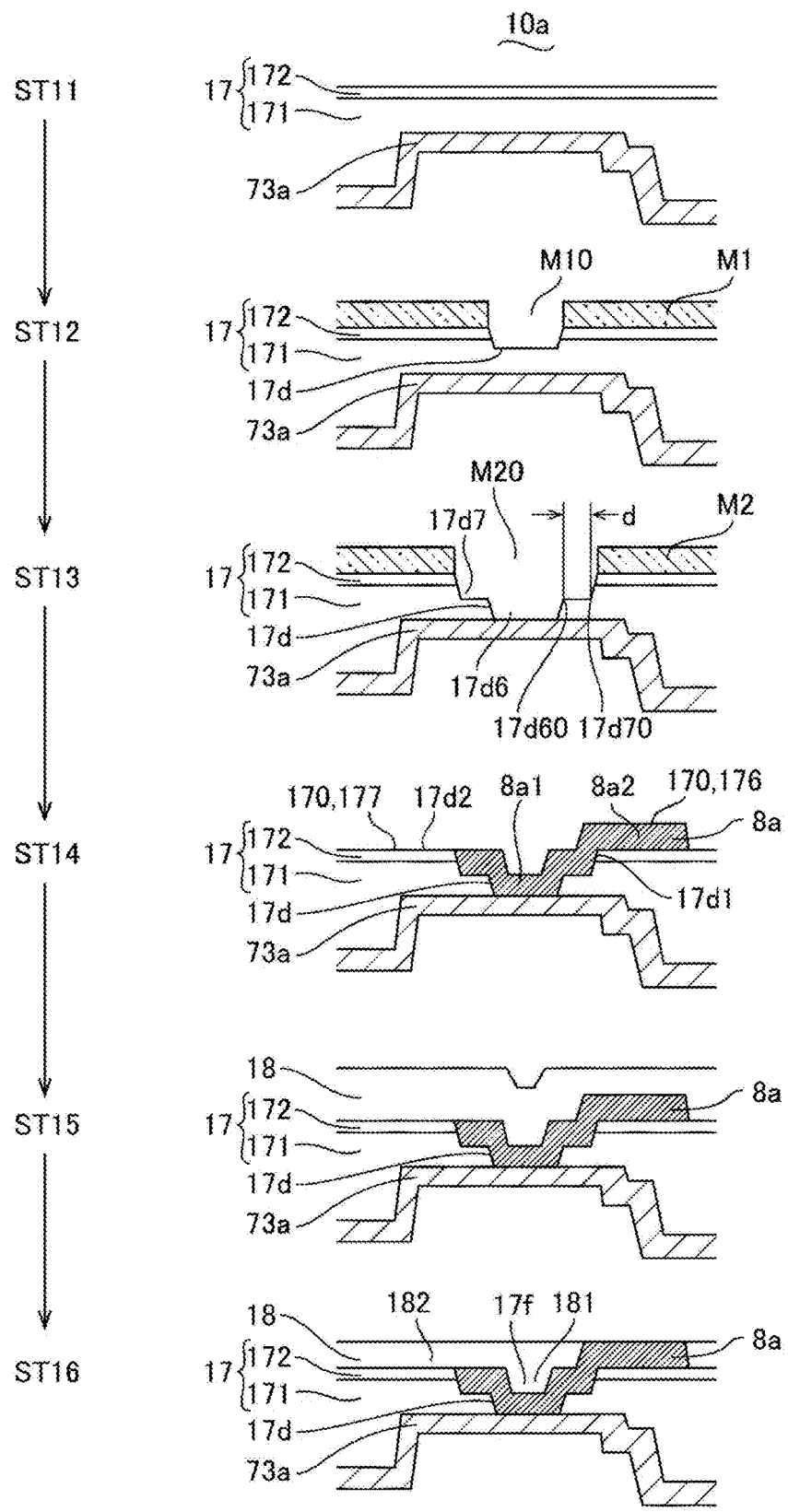
FIG. 15 is a process cross-sectional view illustrating a process for forming the first contact hole and the like illustrated in FIG. 6.
Figure 16:
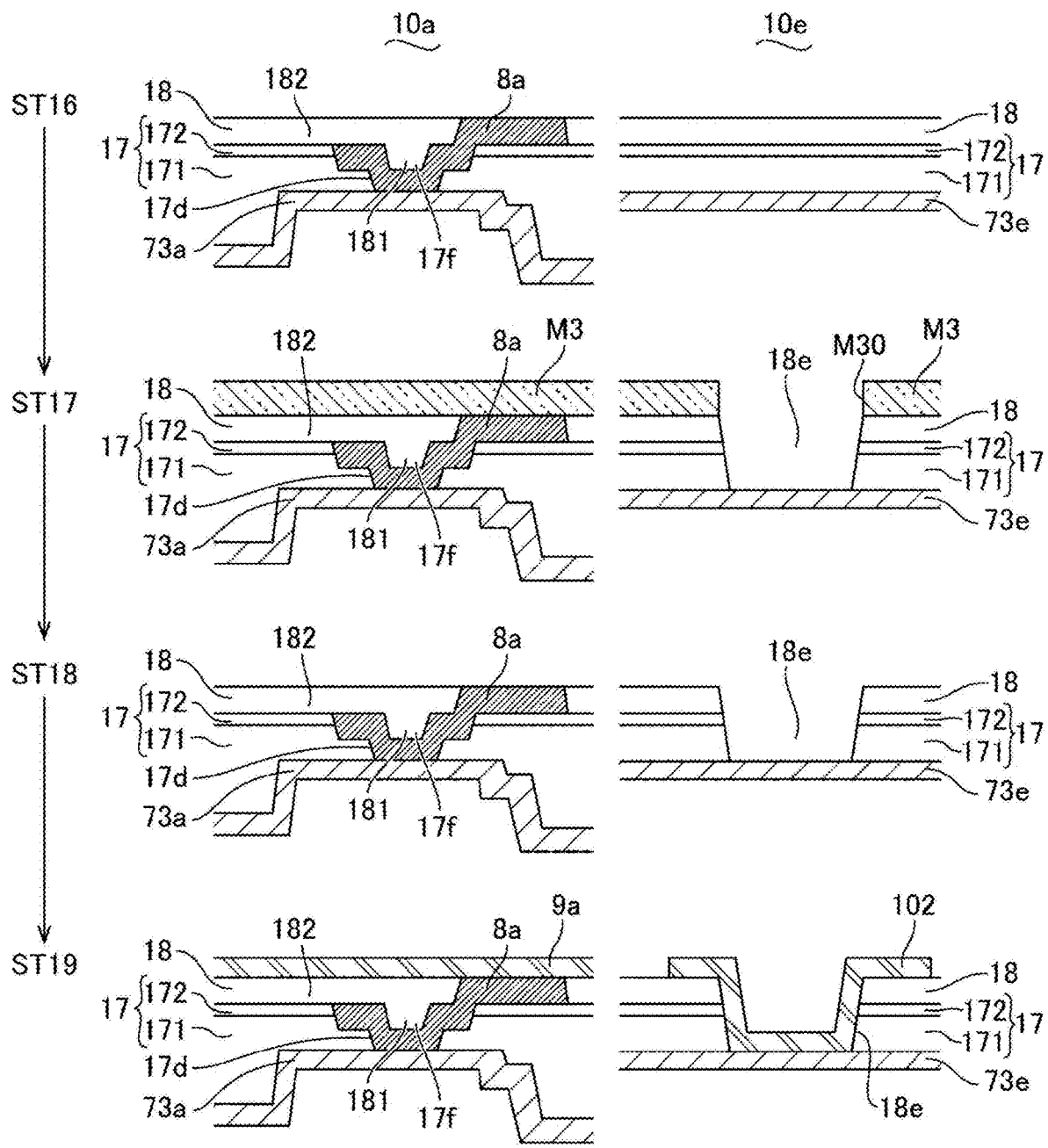
FIG. 16 is a process cross-sectional view illustrating a process for forming a terminal and the like on a first substrate illustrated in FIG. 6.

FIG. 15 is a process cross-sectional view illustrating a process for forming the first contact hole 17d and the like illustrated in FIG. 6. FIG. 16 is a process cross-sectional view illustrating a process for forming a terminal 102 and the like on the first substrate 10 illustrated in FIG. 6. The display region 10a is illustrated in FIG. 15, and the display region 10a and the terminal region 10e are illustrated in FIG. 16. Of the manufacturing process of the electro-optical device 100 of the exemplary embodiment, when the first electrode 73a and the pixel electrode 9a are electrically connected on the first substrate 10, a process illustrated in FIG. 15 and FIG. 16 is performed.

First, at step ST11 illustrated in FIG. 16, after the insulating film 171 made of the silicone oxide film or the like is formed, the surface of the insulating film 171 is leveled using CMP processing or the like. Next, the insulating film 172 made of the boron-containing silicate glass is formed, and the first insulating film 17 is formed.

Next, at step ST12 (a first etching step), in a state in which a first etching mask M1 including a first opening portion M10 is provided on the surface of the first insulating film 17, etching is performed on the first insulating film 17 from the first opening portion M10. At this time, the etching is performed to a partway position in the thickness direction of the first insulating film 17. At step ST12, dry etching is performed using an etching gas that contains fluorine.

Next, at step ST13 (a second etching step), in a state in which a second etching mask M2 including a second opening portion M20 having a larger size than the first opening portion M10 is provided on the surface of the first insulating film 17, etching is performed on the first insulating film 17 from the second opening portion M20, and the first contact hole 17d that penetrates the first insulating film 17 is formed. Thus, the first contact hole 17d includes the first hole 17d6 that configures a section of the first insulating film 17 on the first substrate 10 side and the second hole 17d7 that is communicated with the first hole 17d6 on the opposite side to the first substrate 10. At step ST13 also, similarly to step ST12, dry etching is performed using an etching gas that contains fluorine.

At the time of the above steps, a method can be adopted in which the first etching mask M1 is removed after step ST12 is complete, and the second etching mask M2 is formed in place of the first etching mask M1. Further, when the first etching mask M1 is a resist mask, after step ST12 is complete, a size adjustment step may be performed using irradiation of laser light or the like to enlarge the size of the first opening portion M10 to the size of the second opening portion M20. According to this method, when step ST13 is performed, the first etching mask M1 after the size adjustment step has been performed can be used as the second etching mask M2.

In addition, when the first etching mask M1 is the resist mask, after step ST12 is complete, in the size adjustment step, an ashing step may be performed by irradiating oxygen plasma onto the first etching mask M1, and making the resist mask thinner. According to this method, the size of the first opening portion M10 can be made larger to the size of the second opening portion M20. Thus, by switching the type of the etching gas and performing step ST12, the ashing step, and step ST13, when step ST13 is performed, the resist mask after the size adjustment step has been performed can be used as the second etching mask M2. In this case, in the size adjustment step, an entire edge portion of the resist mask is removed by a certain amount. Thus, the first opening portion M10 becomes the larger second opening portion M20 to the same extent in size around the whole periphery. As a result, a distance d between an end portion 17d60 of the first hole 17d6 on the opposite side to the first substrate 10, and an end portion 17d70 of the second hole 17d7 on the side of the first substrate 10 is the same around the whole periphery of the first contact hole 17d.

Next, at step ST14, after the electrically conducting film is formed on the upper surface side of the first insulating film 17, patterning is performed and the second electrode 8a is formed. In the exemplary embodiment, as described above with reference to FIG. 13, the second electrode 8a is provided with the first section 8a1 that is positioned inside the first contact hole 17d, and the second section 8a2 that extends from the first section 8a1 to the outside of the first contact hole 17d so as to overlap only with the first edge portion 17d1, of the first edge portion 17d1 and the second edge portion 17d2, and that configures the first surface 176. Thus, of the surface of the first insulating film 17 on the opposite side to the first substrate 10, the second surface 177 is configured by the section exposed from the second electrode 8a and the surface of the first section 8a1 on the opposite side to the first substrate 10, and the second surface 177 is positioned further to the first substrate 10 side than the surface of the section of the second electrode 8a that is positioned on the outside of the first contact hole 17d (the first surface 176), by an amount corresponding to the thickness of the second electrode 8a.

Next, at step ST15, the second insulating film 18 having a thickness of approximately 800 nm is formed so as to cover the second electrode 8a and the first insulating film 17 (a film formation step). After that, at step ST16, CMP processing is performed on the surface of the second insulating film 18, and the second electrode 8a is exposed (a leveling step). In this state, of the second insulating film 18, the inside section 181 positioned inside the concave portion 17f that overlaps in a plan view with the first contact hole 17d is connected to the outside section 182 provided on the second surface 177. At the time of these steps, the first contact hole 17d is shallow and the film thickness of the second electrode 8a is relatively thin, and thus, the thickness of the second insulating film 18 formed at step ST15 may be relatively thin. As a result, the CMP processing on the surface of the second insulating film 18 can be completed in a short period of time.

As illustrated in FIG. 16, at a stage at which step ST16 illustrated in FIG. 15 is complete, in the terminal region 10e on which the terminals 102 illustrated in FIG. 1 are arrayed, a state is obtained in which a third electrode 73e of the same layer as the first electrode 73a, the first insulating film 17, and the second insulating film 18 are laminated in this order. To form the pixel electrode 9a and the terminals 102 from this state, step ST17, step ST18, and step ST19 are performed.

At step ST17, in a state in which an etching mask M3 formed of a resist mask and including a third opening portion M30 is provided on the surface of the second insulating film 18, etching is performed from the third opening portion M30, and a second contact hole 18e that penetrates the first insulating film 17 and the second insulating film 18 is formed at a position overlapping in a plan view with the third electrode 73e.

Next, at step ST18, after removing the etching mask M3, the first substrate 10 is caused to come into contact with hydrogen fluoride, and residue and the like inside the second contact hole 18e is removed. Also when step ST18 is performed, of the second insulating film 18, the inside section 181 positioned inside the concave portion 17f that overlaps in a plan view with the first contact hole 17d is connected to the outside section 182, and thus, peeling of the inside section 181 can be suppressed.

Next, at step ST19, after an electrically conducting film, such as an ITO film or the like, is formed on the surface of the second insulating film 18, patterning is performed on the electrically conducting film, and the pixel electrode 9a and the terminals 102 are formed. After that, the first oriented film 19 described with reference to FIG. 2 is formed.

Exemplary Embodiment 2

Figure 17:
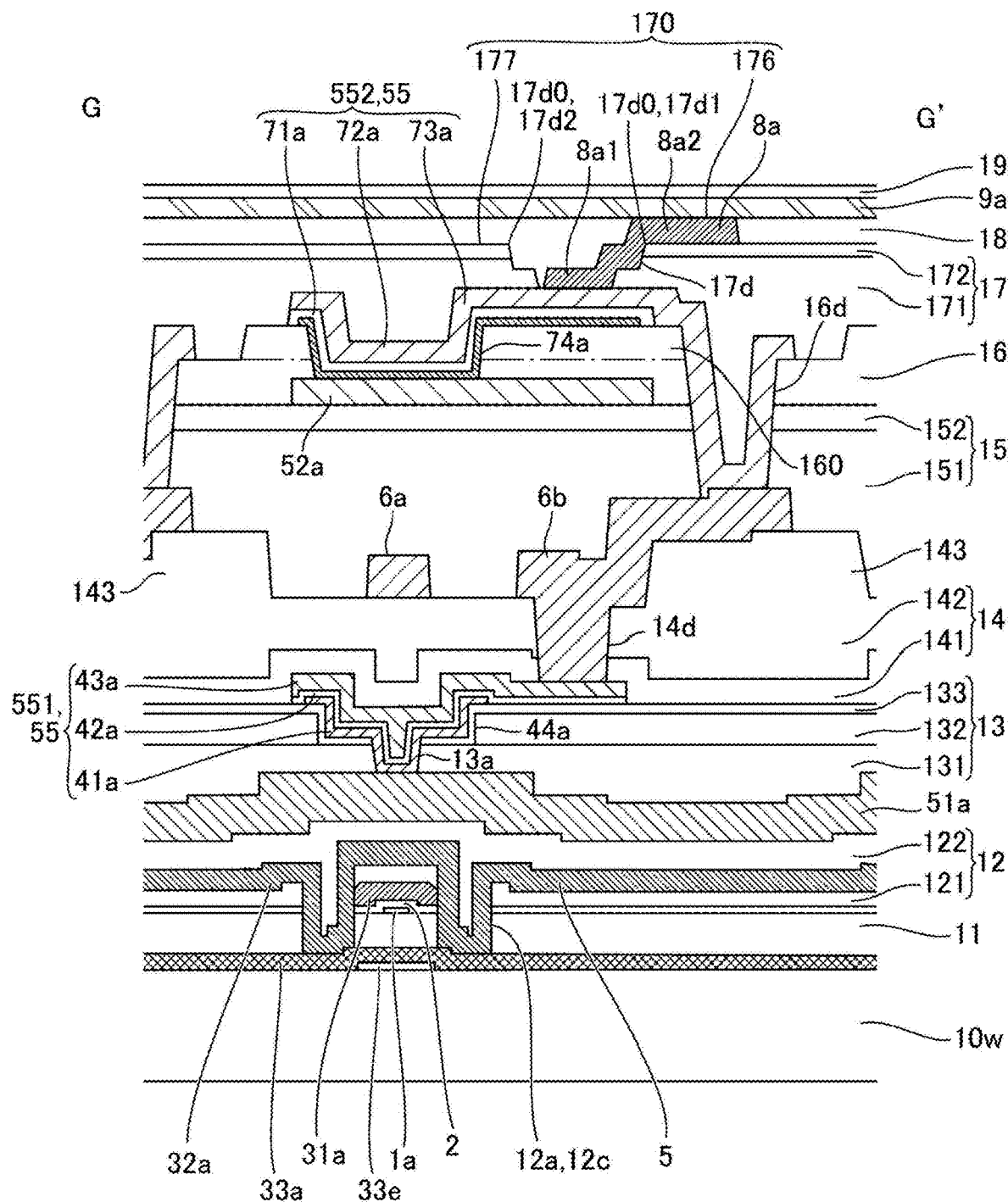
FIG. 17 is an explanatory diagram of the first substrate used in the electro-optical device according to Exemplary Embodiment 2 of the invention.

FIG. 17 is an explanatory diagram of the first substrate 10 used in the electro-optical device 100 according to Exemplary Embodiment 2 of the invention, and corresponds to the cross section G-G' illustrated in FIG. 4. Note that basic configurations in this exemplary embodiment are the same as in Exemplary Embodiment 1, and thus, common portions are denoted by the same reference signs and a description of the common portions will be omitted. In Exemplary Embodiment 1, the first section 8a1 of the second electrode 8a is provided over both the first hole 17d6 and the second hole 17d7. In this exemplary embodiment, as illustrated in FIG. 17, on the first edge portion 17d1 side of the first contact hole 17d, the first section 8a1 is provided on both the first hole 17d6 and the second hole 17d7, but on the second edge portion 17d2 side, the first section 8a1 is provided only on the first hole 17d6 and is not provided on the second hole 17d7. The rest of the configuration is the same as Exemplary Embodiment 1, and an explanation thereof is thus omitted here.

In this exemplary embodiment also, similarly to Exemplary Embodiment 1, of the second insulating film 18, the inside section 181 positioned inside the concave portion 17f that overlaps in a plan view with the first contact hole 17*d* is connected to the outside section 182 provided on the second surface 177, and thus, the same effects as in Exemplary Embodiment 1 are obtained, such as peeling of the inside section 181 being unlikely to occur.

Exemplary Embodiment 3

Figure 18:
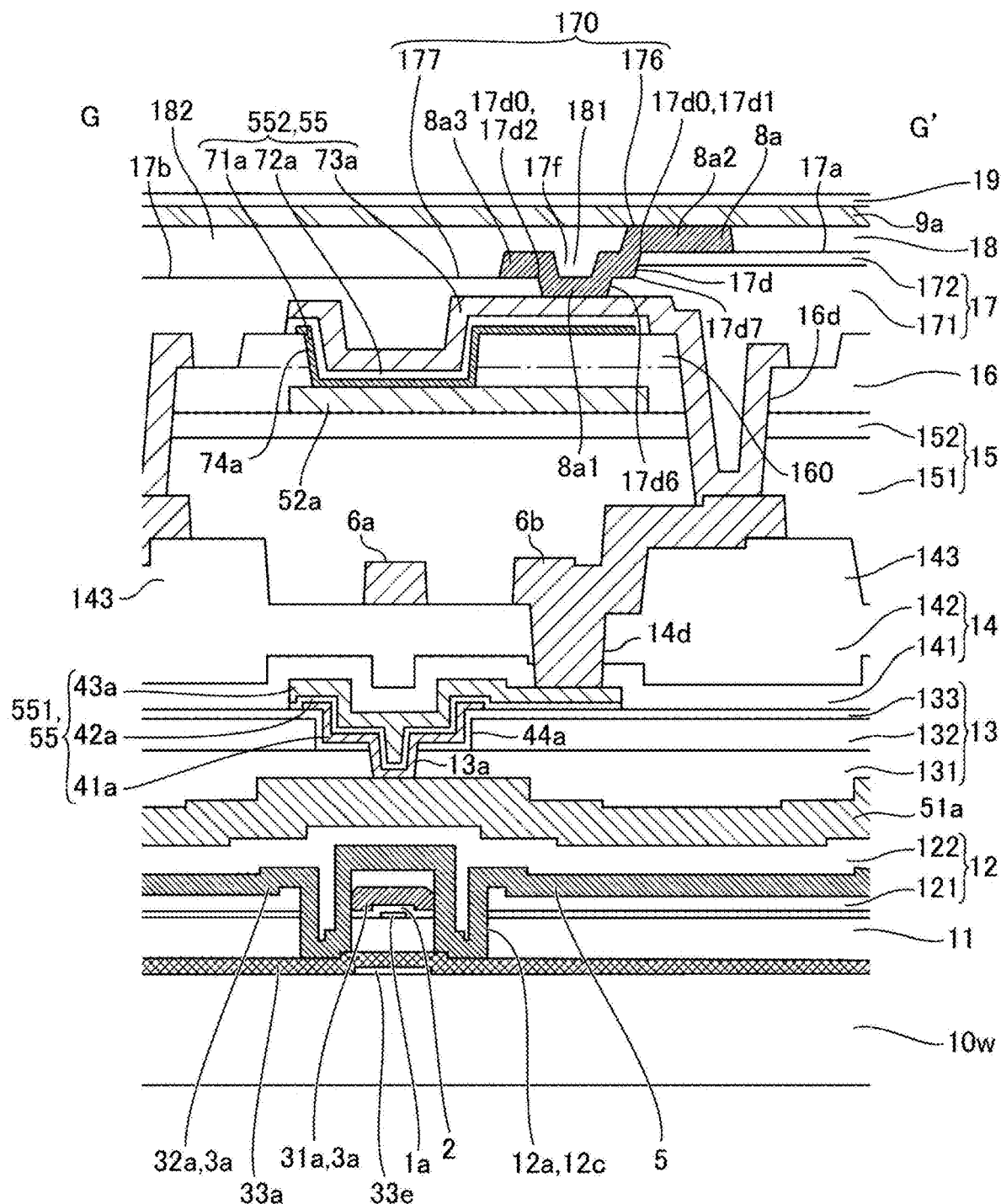
FIG. 18 is an explanatory diagram of the first substrate used in the electro-optical device according to Exemplary Embodiment 3 of the invention.

FIG. 18 is an explanatory diagram of the first substrate 10 used in the electro-optical device 100 according to Exemplary Embodiment 3 of the invention, and corresponds to the cross section G-G' illustrated in FIG. 4. Note that basic configurations in this exemplary embodiment are the same as in Exemplary Embodiment 1, and thus, common portions are denoted by the same reference signs and a description of the common portions will be omitted. In Exemplary Embodiment 1, the first contact hole 17*d* includes the first hole 17*d*6 and the second hole 17*d*7 that is slightly larger than the first hole 17*d*6. In contrast, in this exemplary embodiment, as illustrated in FIG. 18, a section corresponding to the second hole 17*d*7 is formed so as to extend over a wide region on one side with respect to the first contact hole 17*d*, in addition to a region overlapping in a plan view with the first hole 17*d*6.

Thus, on the surface of the first insulating film 17 on the opposite side to the first substrate 10, the distances (heights) from the first substrate 10 at both sides of the first contact hole 17*d* are different, and a first step surface 17*a*, which extends from the first edge portion 17*d*1 that is a part of the opening edge of the first contact hole 17*d*, and a second step surface 17*b*, which extends from the second edge portion 17*d*2 that is another part of the opening edge, on the first substrate 10 side with respect to the first step surface 17*a*, are present.

The second electrode 8*a* is provided with the first section 8*a*1 that is positioned inside the first contact hole 17*d*, and the second section 8*a*2 that extends from the first section 8*a*1 on the first step surface 17*a* on the outside of the first contact hole 17*d* while overlapping with the first edge portion 17*d*1. Furthermore, the second electrode 8*a* includes a third section 8*a*3 that extends from the first section 8*a*1 on the second step surface 17*b* on the outside of the first contact hole 17*d* while overlapping with the second edge portion 17*d*2. Here, the surface of the third section 8*a*3 on the opposite side to the first substrate 10 is positioned on the first substrate 10 side with respect to the surface of the second section 8*a*2 on the opposite side to the first substrate 10. Thus, the surface 170, which is formed by the surface of the second electrode 8*a* on the opposite side to the first substrate 10 and the surface of the first insulating film 17 exposed from the second electrode 8*a*, includes the first surface 176 and the second surface 177 for which distances (heights) from the first substrate 10 are different, the second surface 177 being on the first substrate 10 side with respect to the first surface 176. The rest of the configuration is the same as Exemplary Embodiment 1, and an explanation thereof is thus omitted here.

With this type of configuration also, similarly to Exemplary Embodiment 1, of the second insulating film 18, the inside section 181 positioned inside the concave portion 17*f* that overlaps in a plan view with the first contact hole 17*d* is connected to the outside section 182 provided on the second surface 177. As a result, the same effects as in Exemplary Embodiment 1 are obtained, such as peeling of the inside section 181 being unlikely to occur.

Exemplary Embodiment 4

Figure 19:
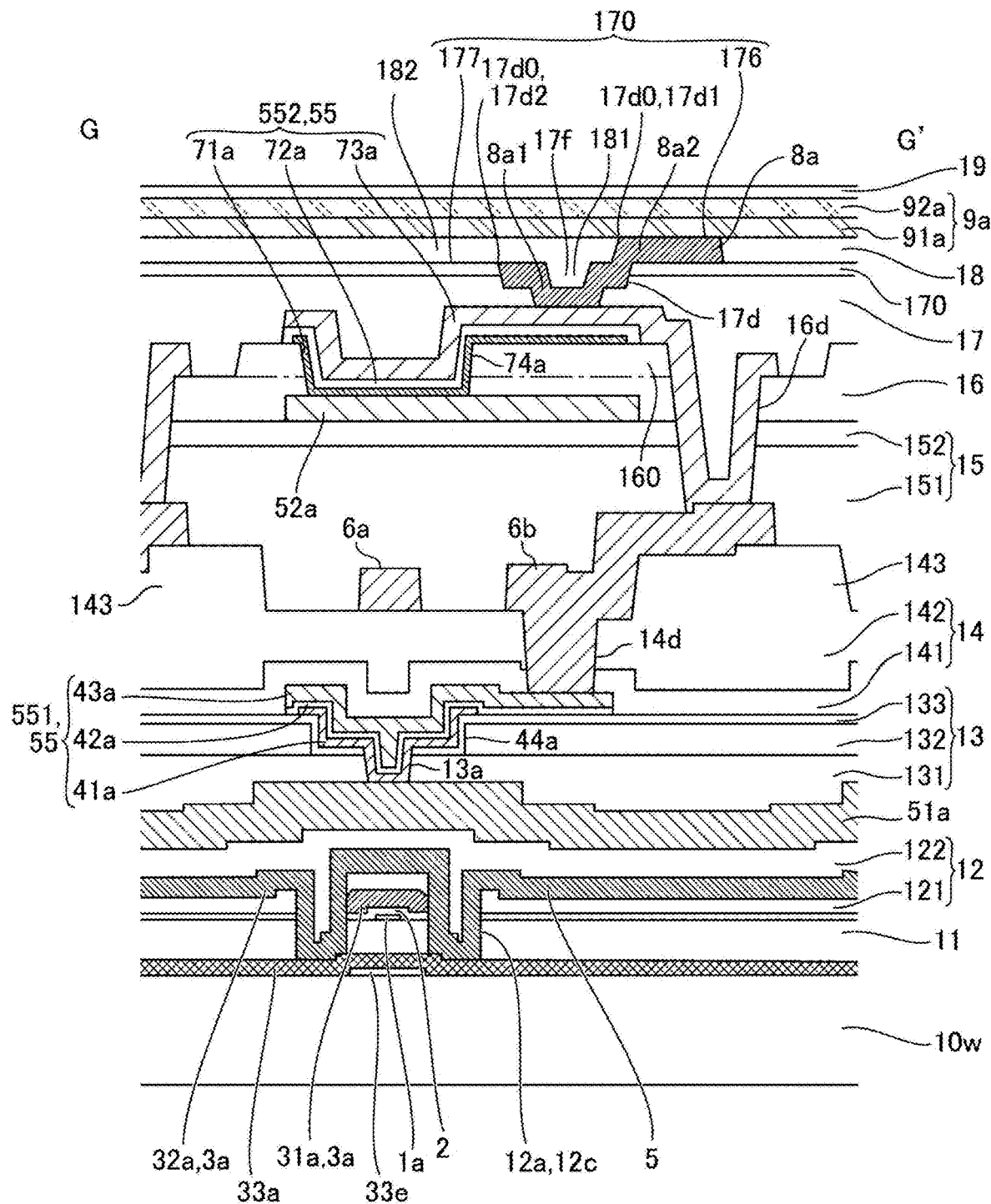
FIG. 19 is an explanatory diagram of the first substrate used in the electro-optical device according to Exemplary Embodiment 4 of the invention.
Figure 20:
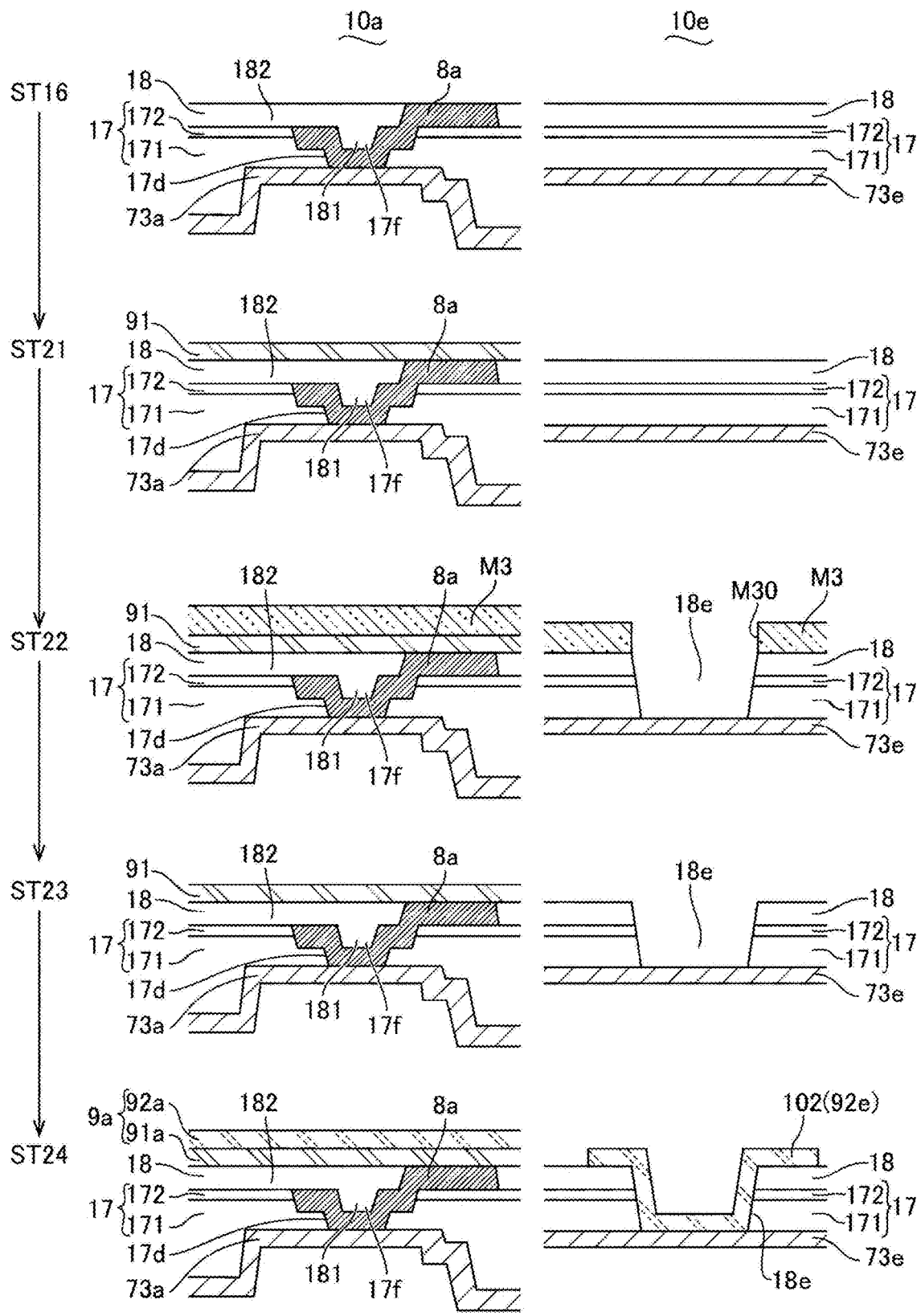
FIG. 20 is a process cross-sectional view illustrating a process for forming a terminal and the like on the first substrate illustrated in FIG. 19.

FIG. 19 is an explanatory diagram of the first substrate 10 used in the electro-optical device 100 according to Exemplary Embodiment 4 of the invention, and corresponds to the cross section G-G' illustrated in FIG. 4. FIG. 20 is a process cross-sectional view illustrating a process for forming the terminal 102 and the like on the first substrate 10 illustrated in FIG. 19. The display region 10*a* and the terminal region 10*e* are illustrated in FIG. 20. Note that basic configurations in this exemplary embodiment are the same as in Exemplary Embodiment 1, and thus, common portions are denoted by the same reference signs and a description of the common portions will be omitted.

In Exemplary Embodiment 1, the pixel electrode 9*a* is configured by a single layer of the electrically conducting film. In contrast, in this exemplary embodiment, as illustrated in FIG. 19, the pixel electrode 9*a* includes a first electrically conducting film 91*a* that is made of an ITO film or the like, and a second electrically conducting film 92*a* that is made of an ITO film or the like and is provided on the surface of the first electrically conducting film 91*a* on the opposite side to the first substrate 10. The rest of the configuration is the same as Exemplary Embodiment 1, and an explanation thereof is thus omitted here.

In the manufacturing method of this electro-optical device 100, after performing step ST11 to step ST16 illustrated in FIG. 15, step ST21 to step ST24 illustrated in FIG. 20 are performed, and the terminals 102 are formed in the terminal region 10*e*. More specifically, in this exemplary embodiment also, as illustrated in FIG. 20, at a stage at which the step ST16 illustrated in FIG. 15 is complete, in the terminal region 10*e*, a state is obtained in which the third electrode 73*e* of the same layer as the first electrode 73*a*, the first insulating film 17, and the second insulating film 18 are laminated in this order.

At step ST21 (a first step), after the first electrically conducting film 91*a*, that is made of an ITO film or the like is formed on the surface of the second insulating film 18, the first electrically conducting film 91*a* is removed from the terminal region 10*e*.

Next, at step ST22 (a second step), in a state in which the etching mask M3 formed of the resist mask including the third opening portion M30 is provided on the surface of the second insulating film 18, etching is performed from the third opening portion M30, and the second contact hole 18*e* that penetrates the first insulating film 17 and the second insulating film 18 is formed in the position overlapping in a plan view with the third electrode 73*e*. Next, at step ST22, after removing the etching mask M3, the first substrate 10 is caused to come into contact with hydrogen fluoride, and residue and the like inside the second contact hole 18*e* is removed.

Next, at step ST23, after the second electrically conducting film 92*a* that is made of the ITO film or the like is formed on the surface of the second insulating film 18 (a third step), patterning is performed on the first electrically conducting film 91*a* and the second electrically conducting film 92*a*, and the pixel electrode 9*a* and the terminals 102 are formed (a fourth step). As a result, while the pixel electrode 9*a* is provided with the first electrically conducting film 91*a* and the second electrically conducting film 92*a*, the terminals 102 are configured by an electrically conducting film 92*e* that is of the same layer as the second electrically conducting film 92*a*.

With this exemplary embodiment also, similarly to Exemplary Embodiment 1, of the second insulating film 18, the inside section 181 positioned inside the concave portion 17*f* that overlaps in a plan view with the first contact hole 17*d* is connected to the outside section 182 provided on the second surface 177. As a result, even after performing the leveling processing on the second insulating film 18, the same effects as in Exemplary Embodiment 1 are obtained, such as peeling of the inside section 181 being unlikely to occur. Further, at step ST22, since the first electrically conducting film 91a is formed so as to cover the second insulating film 18 and the like, peeling of the inside section 181 can be reliably suppressed.

Exemplary Embodiment 5

Figure 21:
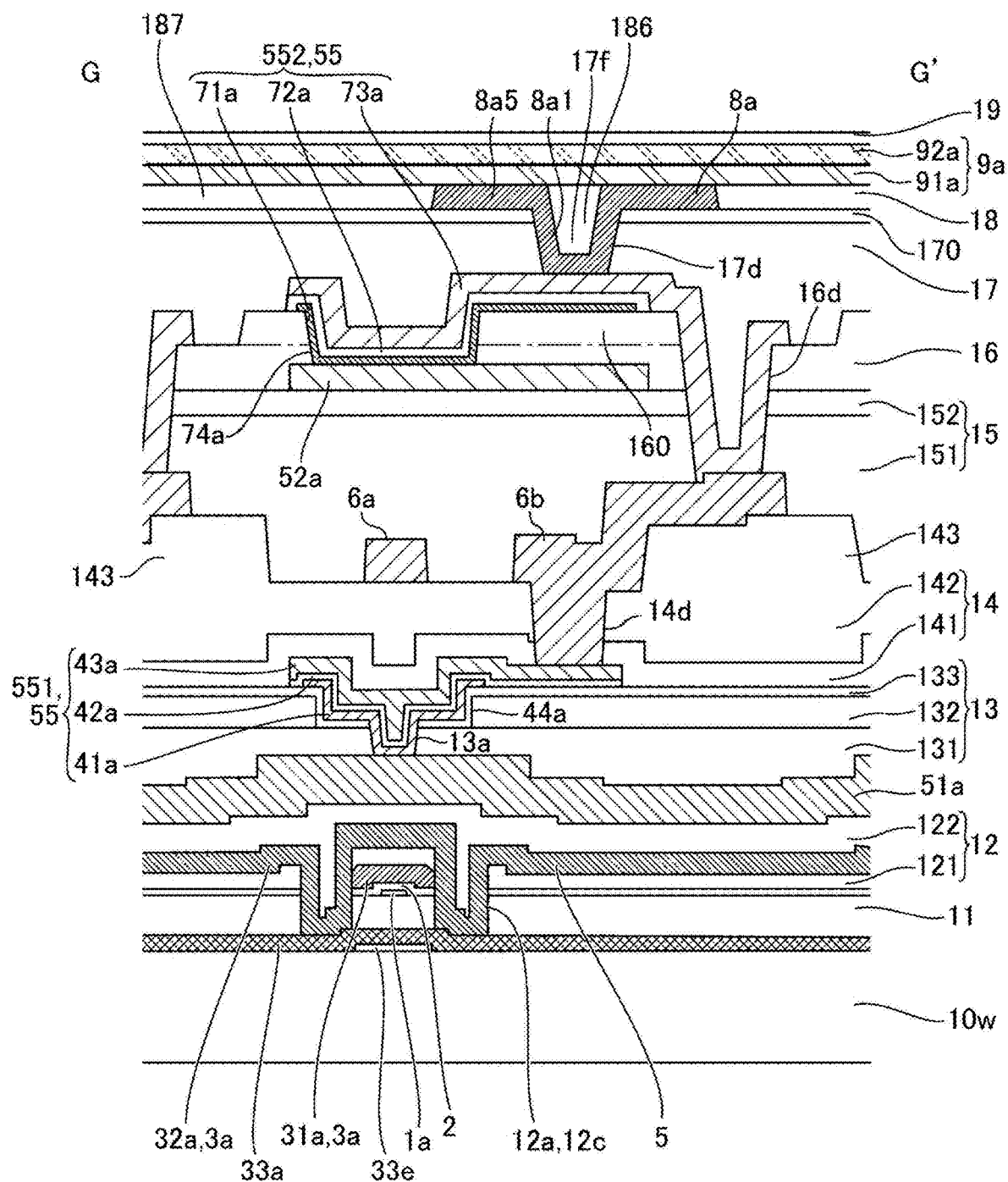
FIG. 21 is an explanatory diagram of a first substrate used in an electro-optical device according to Exemplary Embodiment 5 of the invention.
Figure 22:
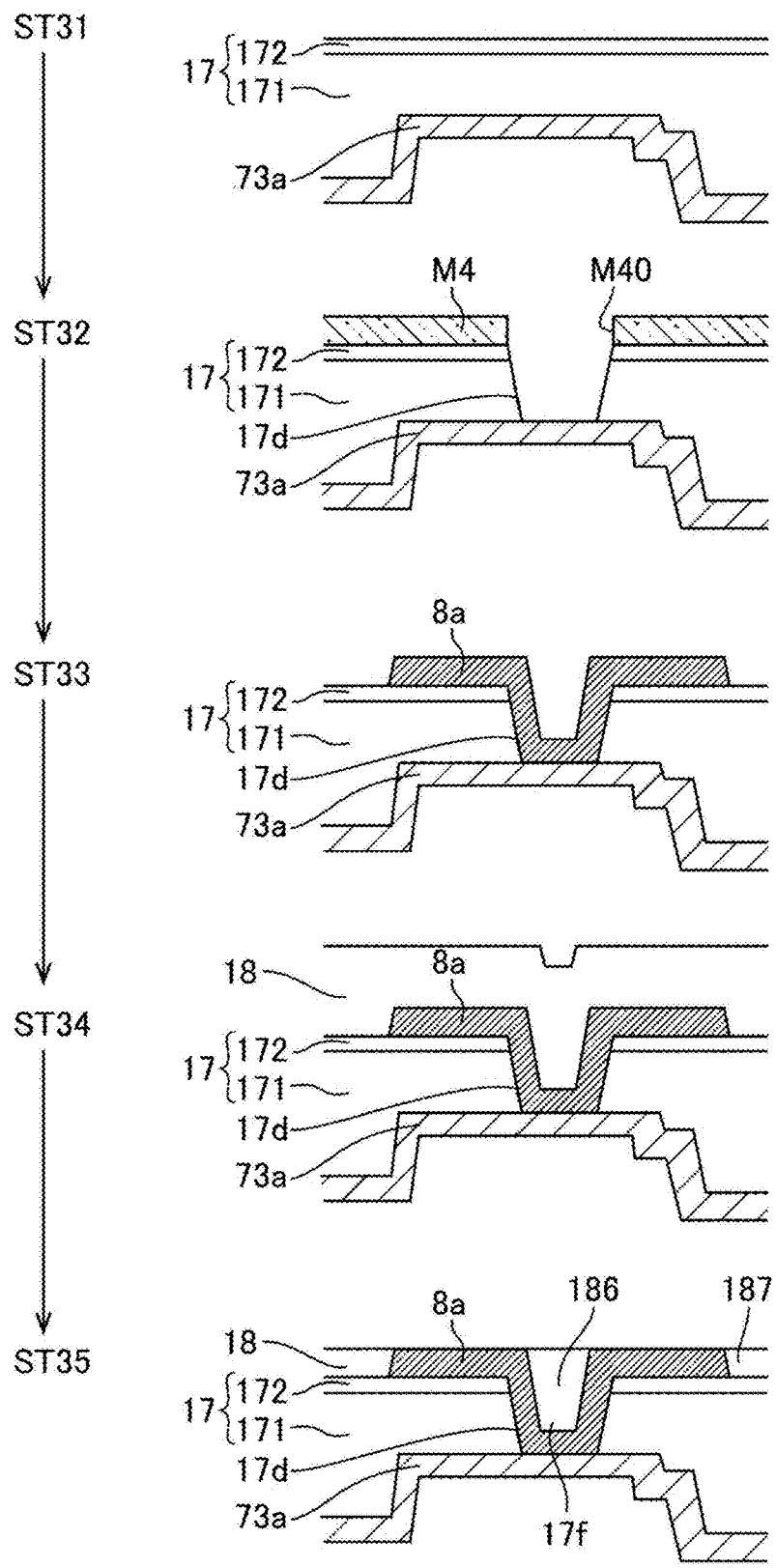
FIG. 22 is a process cross-sectional view illustrating a process for forming the first contact hole and the like illustrated in FIG. 21.
Figure 23:
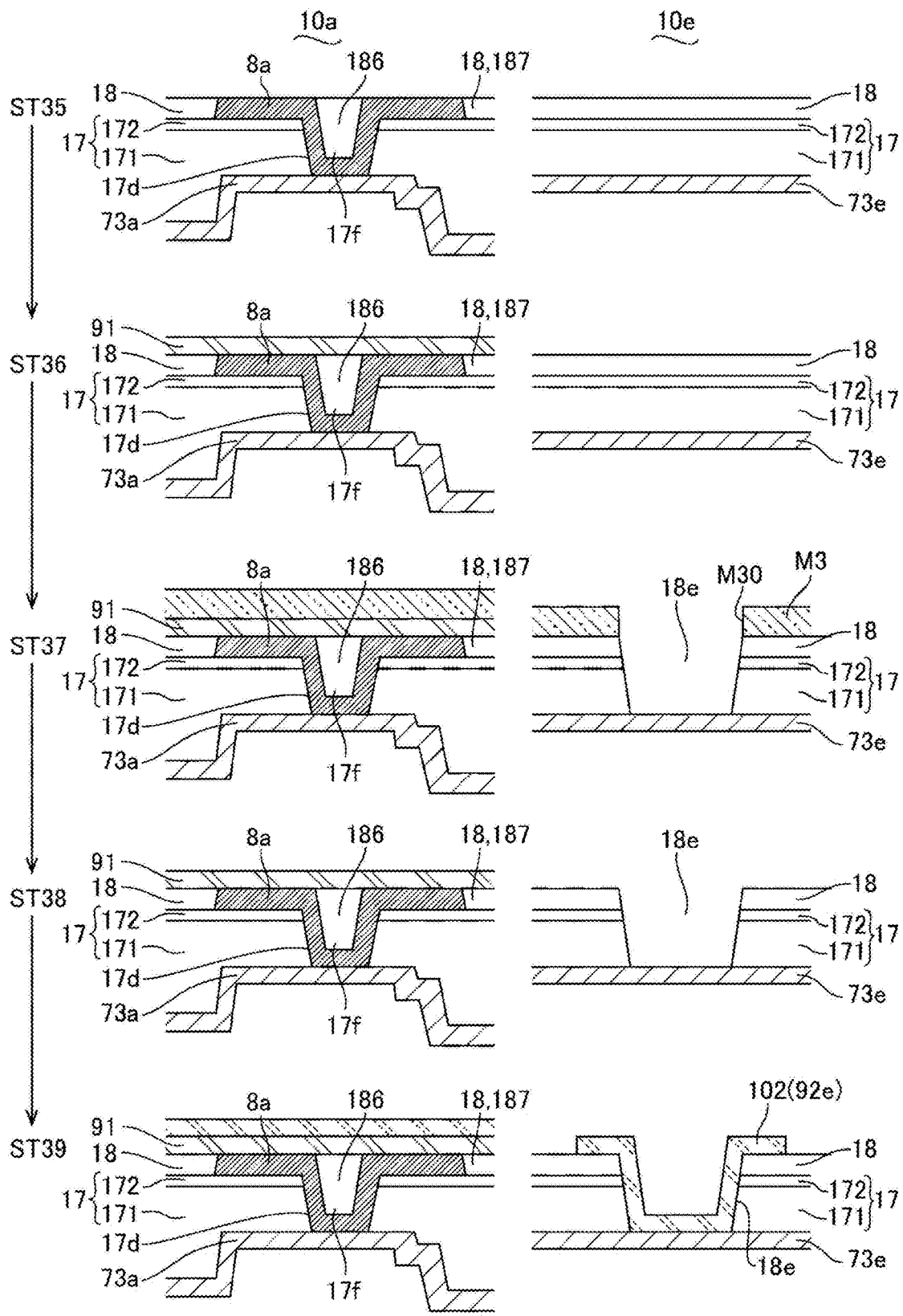
FIG. 23 is a process cross-sectional view illustrating a process for forming a terminal and the like on the first substrate illustrated in FIG. 21.

FIG. 21 is an explanatory diagram of the first substrate 10 used in the electro-optical device 100 according to Exemplary Embodiment 5 of the invention, and corresponds to the cross section G-G' illustrated in FIG. 4. FIG. 22 is a process cross-sectional view illustrating a process for forming the first contact hole 17d and the like illustrated in FIG. 21. FIG. 23 is a process cross-sectional view illustrating a process for forming the terminal 102 and the like on the first substrate 10 illustrated in FIG. 21. The display region 10a is illustrated in FIG. 22, and the display region 10a and the terminal region 10e are illustrated in FIG. 23. Note that basic configurations in this exemplary embodiment are the same as in Exemplary Embodiment 1, and thus, common portions are denoted by the same reference signs and a description of the common portions will be omitted.

As illustrated in FIG. 21, in this exemplary embodiment, when the first contact hole 17d is used to electrically connect the first electrode 73a and the pixel electrode 9a, the second electrode 8a is formed on the surface of the first insulating film 17 on the opposite side to the first substrate 10, and the second electrode 8a is electrically connected to the first electrode 73a via the first contact hole 17d. The second insulating film 18 is formed on the surface of the first insulating film 17 on the opposite side to the first substrate 10, and the second insulating film 18 is a leveling film. Thus, the surface of the second insulating film 18 on the opposite side to the first substrate 10 configures a flat surface that is continuous with the surface of the second electrode 8a on the opposite side to the first substrate 10, and the pixel electrode 9a is provided on this flat surface.

As a result, on the flat surface on which the second insulating film 18 and the second electrode 8a are formed, the pixel electrode 9a is electrically connected to a section of the second electrode 8a that is exposed from the second insulating film 18. According to this configuration, a concave portion caused by the first contact hole 17d in the surface of the pixel electrode 9a on the opposite side to the first substrate 10 does not occur. Thus, the first oriented film 19 can be appropriately formed, and as a result, the liquid crystal molecules used in the electro-optical layer 80 can be appropriately oriented.

In this exemplary embodiment, the second electrode 8a is provided with the first section 8a1 that is positioned inside the first contact hole 17d, and a second section 8a5 that extends from the first section 8a1 to the outside of the first contact hole 17d. The second section 8a5 is formed so as to surround the whole periphery of the first contact hole 17d. Thus, of the second insulating film 18, an inside section 186 positioned inside the concave portion 17f that overlaps in a plan view with the first contact hole 17d is separated from an outside section 187 provided on the outside of the first contact hole 17d, by the second section 8a5 of the second electrode 8a.

Here, the pixel electrode 9a includes the first electrically conducting film 91a that is made of the ITO film or the like, and the second electrically conducting film 92a that is made of the ITO film or the like and that is provided on the surface of the first electrically conducting film 91a on the opposite side to the first substrate 10. The rest of the configuration is the same as Exemplary Embodiment 1, and an explanation thereof is thus omitted here.

Of the manufacturing process of the electro-optical device 100 of this exemplary embodiment, a process illustrated in FIG. 22 and FIG. 23 is performed when the first electrode 73a and the pixel electrode 9a are electrically connected on the first substrate 10. First, at step ST31 illustrated in FIG. 22, after the insulating film 171 made of the silicone oxide film or the like is formed, the surface of the insulating film 171 is leveled using CMP processing or the like. Next, the insulating film 172 made of the boron-containing silicate glass is formed, and the first insulating film 17 is formed.

Next, at step ST32 (the first etching step), in a state in which a fourth etching mask M4 including a fourth opening portion M40 is provided on the surface of the first insulating film 17, etching is performed on the first insulating film 17 from the fourth opening portion M40, and the first contact hole 17d that penetrates the first insulating film 17 is formed. Next, at step ST33, after the electrically conducting film is formed on the upper surface side of the first insulating film 17, patterning is performed and the second electrode 8a is formed.

Next, at step ST34, after the second insulating film 18 is formed so as to cover the second electrode 8a and the first insulating film 17, at step ST35, CMP processing is performed on the surface of the second insulating film 18, and the second electrode 8a is exposed. As a result, of the second insulating film 18, the inside section 186 positioned inside the concave portion 17f that overlaps in a plan view with the first contact hole 17d is separated from the outside section 187 formed on the outside of the first contact hole 17d.

As illustrated in FIG. 23, at a stage at which step ST35 illustrated in FIG. 22 is complete, in the terminal region 10e, a state is obtained in which the third electrode 73e of the same layer as the first electrode 73a, the first insulating film 17, and the second insulating film 18 are laminated in this order. To form the pixel electrode 9a and the terminals 102 from this state, step ST36, step ST37, step ST38, and step ST39 are performed.

At step ST36 (the first step), after the first electrically conducting film 91a that is made of the ITO film or the like is formed on the surface of the second insulating film 18, the first electrically conducting film 91a is removed from the terminal region 10e.

Next, at step ST37 (the second step), in a state in which the etching mask M3 formed of the resist mask including the third opening portion M30 is provided on the surface of the second insulating film 18, etching is performed from the third opening portion M30, and the second contact hole 18e that penetrates the first insulating film 17 and the second insulating film 18 is formed in the position overlapping in a plan view with the third electrode 73e. Next, at step ST38, after removing the etching mask M3, the first substrate 10 is caused to come into contact with hydrogen fluoride, and residue and the like inside the second contact hole 18e is removed.

Next, at step ST39, after the second electrically conducting film 92a that is made of the ITO film or the like is formed on the surface of the second insulating film 18 (the third step), patterning is performed on the first electrically conducting film 91a and the second electrically conducting film 92a, and the pixel electrode 9a and the terminals 102 are formed (the fourth step). As a result, while the pixel electrode 9a is provided with the first electrically conducting film 91a and the second electrically conducting film 92a, the terminals 102 are configured by the electrically conducting film 92*e* that is of the same layer as the second electrically conducting film 92*a*.

In this exemplary embodiment also, similarly to Exemplary Embodiment 4, since, at step ST38, the first electrically conducting film 91*a* is formed so as to cover the second insulating film 18 and the like, peeling of the inside section 186 can be reliably suppressed.

Other Exemplary Embodiments

In the above-described Exemplary Embodiments 1 to 4, the first contact hole 17*d* is configured by the first hole 17*d*6 and the second hole 17*d*7, but the first contact hole 17*d* may be configured by the single hole, as in Exemplary Embodiment 5. In the above-described Exemplary Embodiment 5, the first contact hole 17*d* is configured by the single hole, but the first contact hole 17*d* may be configured by the first hole 17*d*6 and the second hole 17*d*7, as in Exemplary Embodiments 1 to 4.

In the above-described Exemplary Embodiments 1 to 5, the example is given in which the light source light is incident from the second substrate 20 side, but the invention may also be applied to a case in which the light source light is incident from the first substrate 10 side. Further, in the above-described Exemplary Embodiments 1 to 5, the electro-optical device 100 is the transmissive liquid crystal device. However, the invention may be applied to a case in which the electro-optical device 100 is a reflection-type liquid crystal device.

In the above-described Exemplary Embodiments 1 to 5, the electro-optical device 100 is the transmissive liquid crystal device. However, the invention may be applied to a case in which the electro-optical device 100 is a reflection-type liquid crystal device.

Installation Example for Electronic Apparatus

Figure 24:
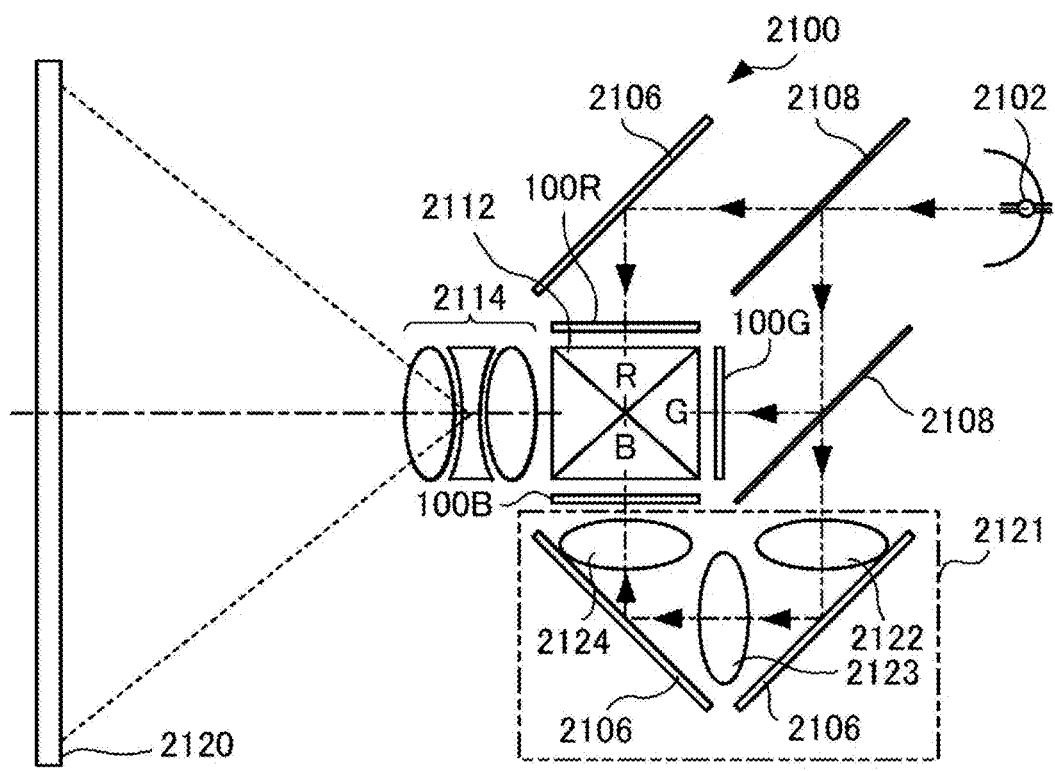
FIG. 24 is a schematic block diagram of a projection-type display apparatus (an electronic apparatus) employing the electro-optical device to which the invention is applied.

An electronic apparatus employing the electro-optical device 100 according to the above-described Exemplary Embodiments is described below. FIG. 24 is a schematic configuration diagram illustrating a projection-type display apparatus (the electronic apparatus) employing the electro-optical device 100 to which the invention is applied. In FIG. 24, a phase difference plate, a polarizing plate, and the like are not illustrated. A projection-type display device 2100 illustrated in FIG. 24 is an example of the electronic apparatus employing the electro-optical device 100. The projection-type display device 2100, in which the electro-optical device 100 is used as a light valve, can conduct high-definition and bright display without making the apparatus large. As illustrated in FIG. 24, a lamp unit 2102 (a light-source portion) including a white light source such as a halogen lamp is installed inside the projection-type display device 2100. The incident light emitted from the lamp unit 2102 is split into the three primary colors of R (red), G (green), and B (blue) by means of three mirrors 2106 and two dichroic mirrors 2108 installed inside. The split incident light is guided to light valves 100R, 100G, and 100B corresponding to each of the primary colors, and then modulated. Note that the light of the color B has a long optical path compared to the light of the other color R and color G. Thus, the light of the color B is guided through a relay lens system 2121 including an incidence lens 2122, a relay lens 2123, and an emission lens 2124 to prevent loss.

The light modulated by each of the light valves 100R, 100G, and 100B is incident on a dichroic prism 2112 from three directions. Then, at the dichroic prism 2112, the light of the color R and the light of the color B are reflected at 90 degrees, and the light of the color G passes through. Thus, images of each of the primary colors are synthesized, and subsequently color images are projected onto a screen 2120 using a projection lens group 2114 (a projection optical system).

Other Projection-Type Display Devices

Note that the projection-type display device may be configured such that an LED light source and the like that emits light of each of colors is used as a light-source unit and the light of the colors emitted from the LED light source are each supplied to different liquid-crystal devices for each color of light.

Other Electronic Apparatuses

The electronic apparatus including the electro-optical device 100 to which the invention is applied is not limited to the projection-type display device 2100 of the above-described exemplary embodiment. Other examples of the electronic apparatus include a projection-type Head Up Display (HUD), a direct-view type Head Mounted Display (HMD), a personal computer, a digital still camera, a liquid crystal television, and the like.

The entire disclosure of Japanese Patent Application No. 2018-011306, filed Jan. 26, 2018 is expressly incorporated by reference herein.

What is claimed is:

1. An electro-optical device comprising:

a substrate;

a first electrode on a one side of the substrate;

a first insulating film on a surface of the first electrode on an opposite side from the substrate;

a first contact hole penetrating the first insulating film at a position overlapping in a plan view with the first electrode;

a second electrode on a surface of the first insulating film on the opposite side from the substrate and electrically connected to the first electrode via the first contact hole;

a second insulating film with a surface on the opposite side from the substrate and contiguous to a contiguous surface of the second electrode on the opposite side from the substrate; and a pixel electrode on a surface of the second insulating film on the opposite side from the substrate, wherein the first contact hole includes a first hole that configures a section of the first insulating film on a substrate side, and a second hole that has a larger size than the first hole and that communicates with the first hole on the opposite side from the substrate, a distance between an end portion of the first hole on the opposite side from the substrate, and an end portion of the second hole on the substrate side is substantially the same around the whole periphery of the first contact hole, the contiguous surface of the second electrode has (i) a first portion that extends from a position overlapping in a plan view with a first edge portion of an opening edge of the first contact hole, toward the outside of the first contact hole and that is in contact with the pixel electrode, and (ii) a second portion that overlaps in a plan view with the first contact hole on the substrate side with respect to the first portion and that is in contact with a surface of the second insulating film on the substrate side, and an inside section of the second insulating film inside a concave portion overlapping in a plan view with the first contact hole is connected to an outside section of the concave portion of the second insulating film at the second portion.

2. The electro-optical device according to claim 1, wherein
the second electrode includes a first section that is positioned inside the first contact hole, and a second section that, of the first edge portion and the second edge portion, only overlaps with the first edge portion, and extends from the first section to the outside of the first contact hole.

3. The electro-optical device according to claim 1, wherein
in a terminal region of the substrate,
the electro-optical device includes
a third electrode of the same layer as the first electrode,
a second contact hole penetrating the first insulating film and the second insulating film at a position overlapping in a plan view with the third electrode and
a terminal provided on a surface of the second insulating film on the opposite side to the substrate and being electrically connected to the third electrode via the second contact hole,
the pixel electrode includes a first electrically conducting film, and a second electrically conducting film provided on a surface of the first electrically conducting film on the opposite side to the substrate, and
the terminal is configured by an electrically conducting film of the same layer as the second electrically conducting film.

4. A manufacturing method for the electro-optical device according to claim 3, comprising:
forming the second insulating film and leveling the second insulating film to obtain a continuous flat surface formed by a surface of the second electrode and the surface of the second insulating film on the opposite side to the substrate,
subsequently performing a first step for forming the first electrically conducting film on a display region in which the pixel electrode is provided;
performing a second step for forming the second contact hole;
performing a third step for forming the second electrically conducting film on the display region and the terminal region; and
performing a fourth step for patterning the first electrically conducting film and the second electrically conducting film to form the pixel electrode and the terminal.

5. A manufacturing method for the electro-optical device according to claim 1, the method comprising:
forming the first electrode and the first insulating film;
subsequently performing first etching on the first insulating film, with an etching mask including a first opening portion, provided on the surface on the opposite side to the substrate to form the first hole, the first etching being performed through the first opening portion;
performing size adjustment in which the first opening portion is enlarged to form a second opening portion of a larger size than the first opening portion; and
performing second etching on the first insulating film through the second opening portion to form the second hole.

6. The manufacturing method according to claim 5 for the electro-optical device, wherein
in the size adjustment, the first opening portion is enlarged to form the second opening portion by removing a certain amount around an entire edge portion of the etching mask.

7. An electronic apparatus comprising:
the electro-optical device according to claim 1.

8. An electro-optical device comprising:
a substrate;
a first electrode on a one side of the substrate;
a first insulating film on a surface of the first electrode on an opposite side from the substrate;
a first contact hole penetrating the first insulating film at a position overlapping in a plan view with the first electrode;
a second electrode on a surface of the first insulating film on the opposite side from the substrate and electrically connected to the first electrode via the first contact hole;
a second insulating film with a surface on the opposite side from the substrate and contiguous to a contiguous surface of the second electrode on the opposite side from the substrate;
a third insulating film with the first electrode on a surface of the third insulating film on the opposite side from the substrate, and
a pixel electrode on a surface of the second insulating film on the opposite side from the substrate, wherein
the first contact hole includes a first hole that configures a section of the first insulating film on the substrate side, and a second hole that has a larger size than the first hole and that communicates with the first hole on the opposite side to the substrate,
the third insulating film includes a convex portion that protrudes to the opposite side from the substrate at a position overlapping in a plan view with the first contact hole,
the contiguous surface of the second electrode has (i) a first portion that extends from a position overlapping in a plan view with a first edge portion of an opening edge of the first contact hole, toward the outside of the first contact hole and that is in contact with the pixel electrode, and (ii) a second portion that overlaps in a plan view with the first contact hole on the substrate side with respect to the first portion and that is in contact with a surface of the second insulating film on the substrate side, and
an inside section of the second insulating film inside a concave portion overlapping in a plan view with the first contact hole is connected to an outside section of the concave portion of the second insulating film at the second portion.

* * * * *